United States Patent
Tan et al.

(10) Patent No.: US 12,125,944 B2
(45) Date of Patent: Oct. 22, 2024

(54) SEMIPOLAR MICRO-LED

(71) Applicant: Meta Platforms Technologies, LLC, Menlo Park, CA (US)

(72) Inventors: Wei Sin Tan, Plymouth (GB); Andrea Pinos, Plymouth (GB); Xiang Yu, Plymouth (GB); Samir Mezouari, Swindon (GB)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 451 days.

(21) Appl. No.: 17/510,282

(22) Filed: Oct. 25, 2021

(65) Prior Publication Data

US 2023/0130445 A1 Apr. 27, 2023

(51) Int. Cl.
| | |
|---|---|
| H01L 33/24 | (2010.01) |
| H01L 25/075 | (2006.01) |
| H01L 33/00 | (2010.01) |
| H01L 33/06 | (2010.01) |
| H01L 33/14 | (2010.01) |
| H01L 33/18 | (2010.01) |
| H01L 33/32 | (2010.01) |

(Continued)

(52) U.S. Cl.
CPC .......... H01L 33/24 (2013.01); H01L 25/0753 (2013.01); H01L 33/0075 (2013.01); H01L 33/06 (2013.01); H01L 33/145 (2013.01); H01L 33/18 (2013.01); H01L 33/32 (2013.01); H01L 33/405 (2013.01); H01L 33/62 (2013.01)

(58) Field of Classification Search
CPC . H01L 33/24; H01L 25/0753; H01L 33/0075; H01L 33/06; H01L 33/145; H01L 33/18; H01L 33/32; H01L 33/405; H01L 33/62; H01L 33/30; H01L 33/0062; H01L 33/16
See application file for complete search history.

(56) References Cited

U.S. PATENT DOCUMENTS

| | | | | |
|---|---|---|---|---|
| 9,368,679 B2 * | 6/2016 | Yamane | ............. | H01L 21/0259 |
| 9,935,237 B2 * | 4/2018 | Schellhammer | ...... | H01L 33/025 |
| 2014/0103359 A1 | 4/2014 | Shim et al. | | |

(Continued)

FOREIGN PATENT DOCUMENTS

CN 105428486 A 3/2016

OTHER PUBLICATIONS

International Search Report and Written Opinion for International Application No. PCT/US2022/046806, mailed Feb. 2, 2023, 10 pages.

*Primary Examiner* — Mark W Tornow
(74) *Attorney, Agent, or Firm* — Weaver Austin Villeneuve & Sampson LLP

(57) ABSTRACT

A light emitting diode includes an n-type semiconductor layer including a pit structure formed therein, active layers grown only on sidewalls of the pit structure and configured to emit light, and a p-type semiconductor layer on the active layers and at least partially in the pit structure. In one embodiment, the pit structure is characterized by a shape of an inverted pyramid. The pit structure is formed in the n-type semiconductor layer by, for example, etching the n-type semiconductor layer using an etch mask layer having apertures with slanted sidewalls, or growing the n-type semiconductor layer on a substrate through a mask layer having an array of apertures.

20 Claims, 24 Drawing Sheets

(51) Int. Cl.
*H01L 33/40* (2010.01)
*H01L 33/62* (2010.01)

(56) References Cited

U.S. PATENT DOCUMENTS

| | | | |
|---|---|---|---|
| 2015/0024531 A1* | 1/2015 | Ting | H01L 33/0066 438/45 |
| 2016/0149073 A1* | 5/2016 | Shu | H01L 33/32 438/47 |
| 2016/0315224 A1* | 10/2016 | Komada | H01L 21/02505 |
| 2017/0194476 A1* | 7/2017 | Brueck | H01L 21/02494 |
| 2020/0243716 A1 | 7/2020 | Bergbauer et al. | |
| 2021/0167268 A1 | 6/2021 | Pendse | |

* cited by examiner

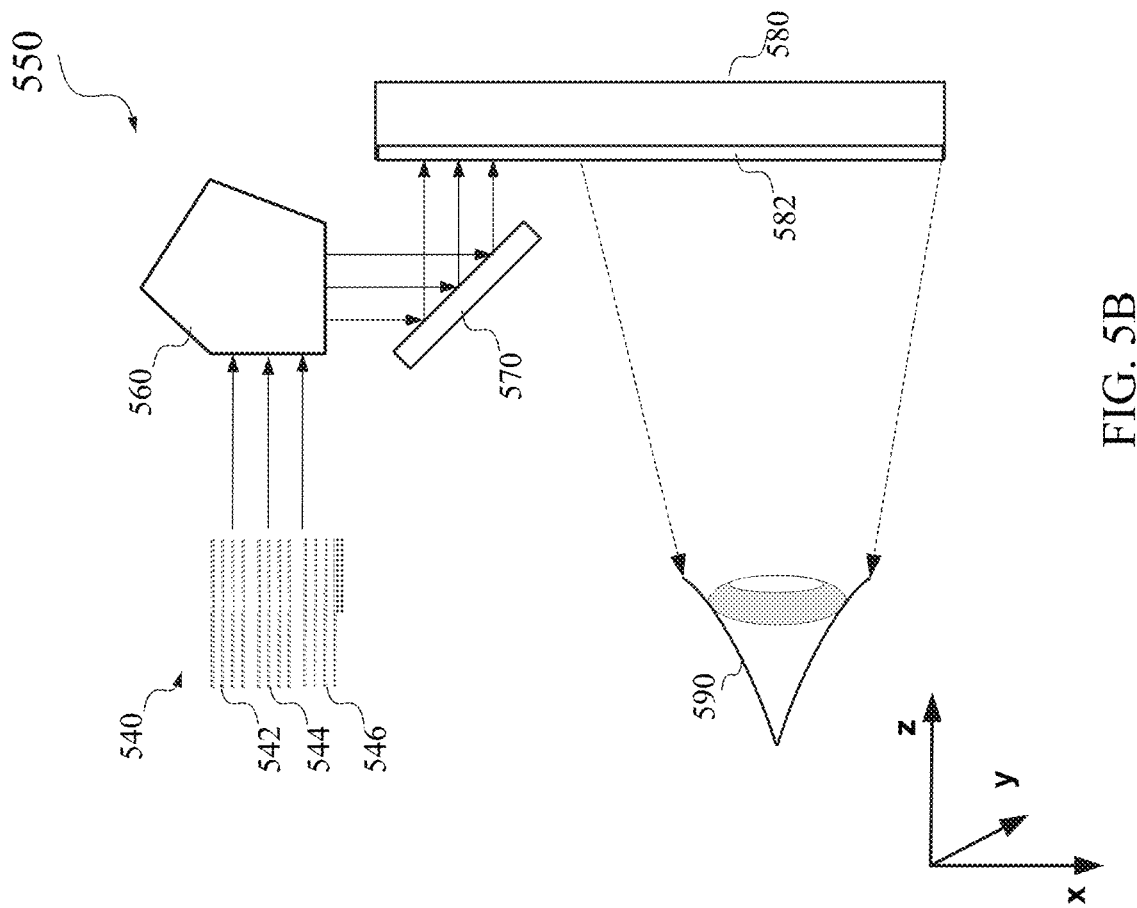
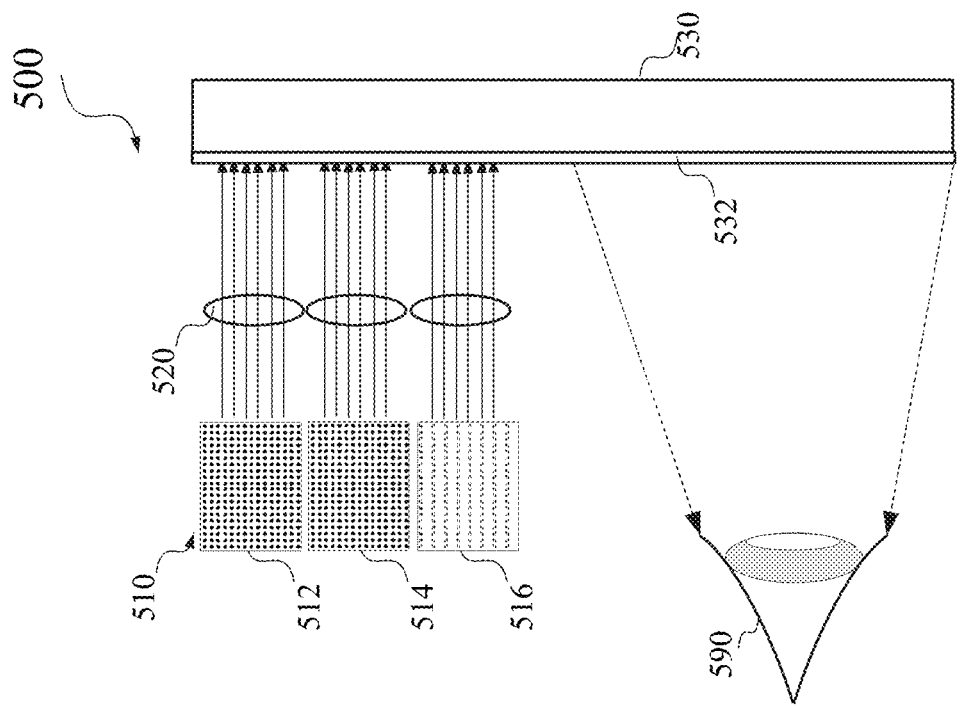
FIG. 5B
FIG. 5A

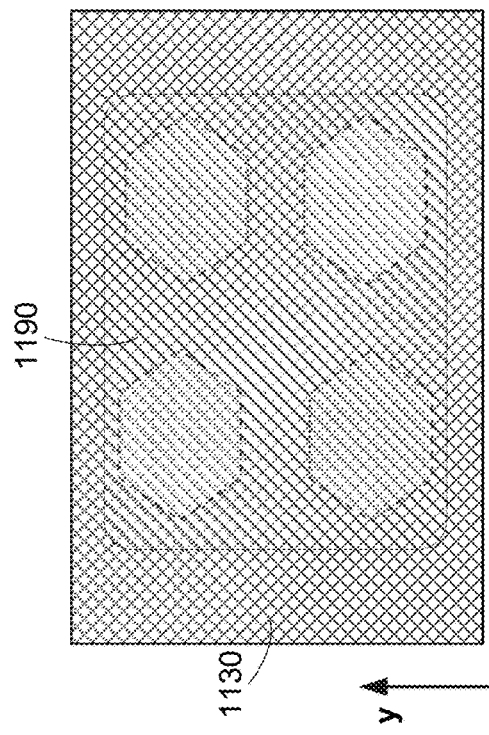
FIG. 11E
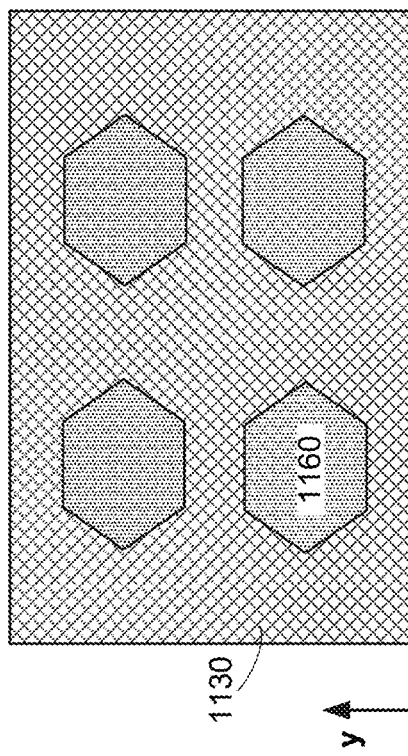
FIG. 11G
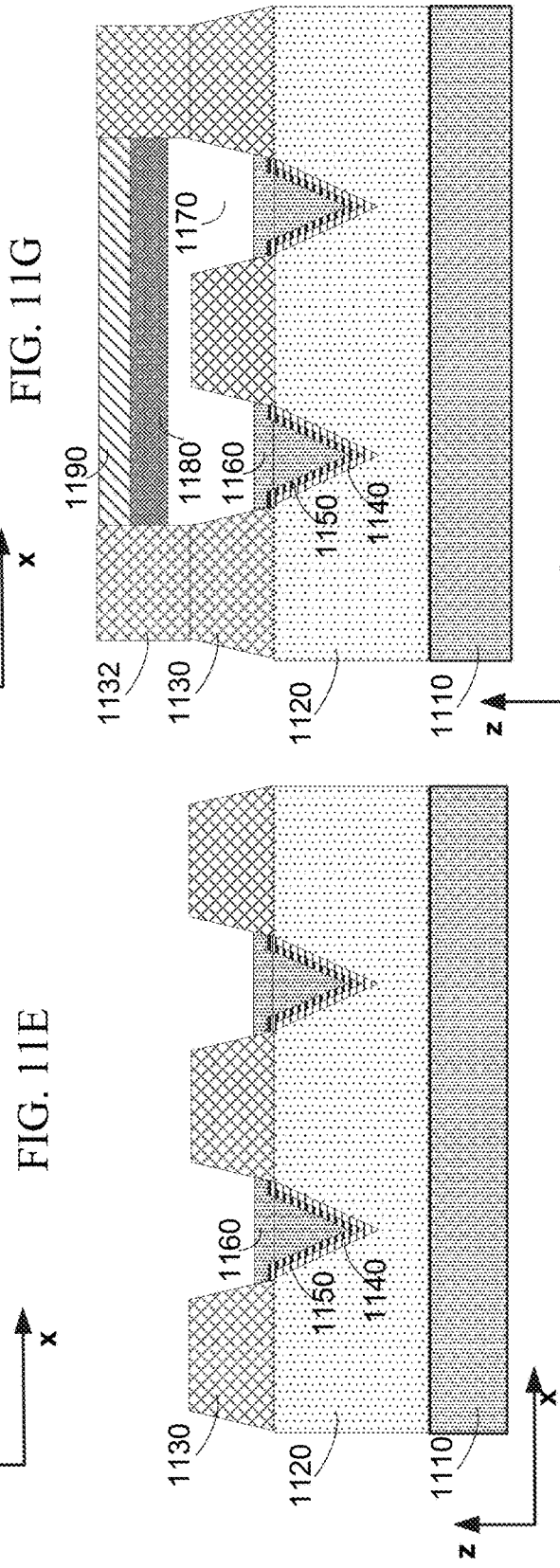
FIG. 11F
FIG. 11H

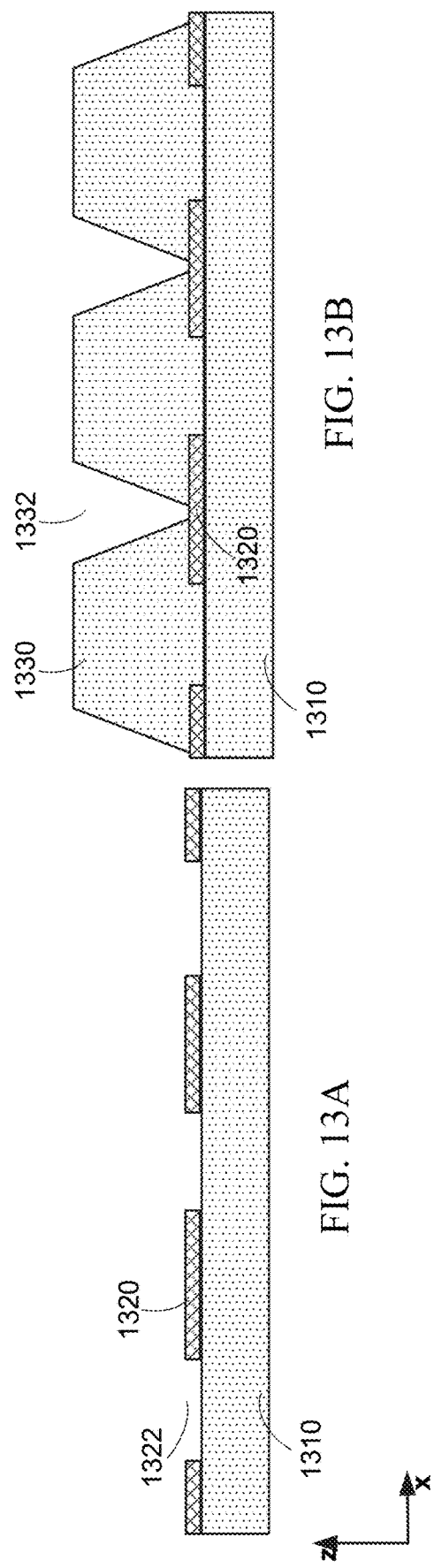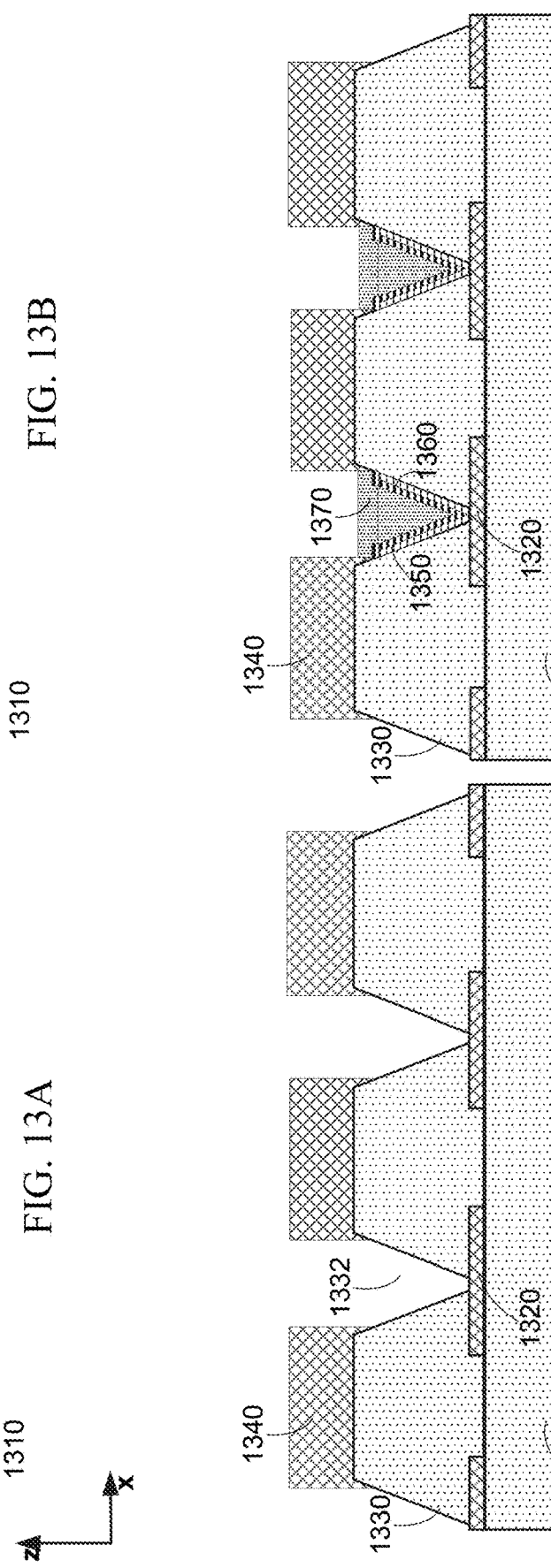
FIG. 13A
FIG. 13B
FIG. 13C
FIG. 13D

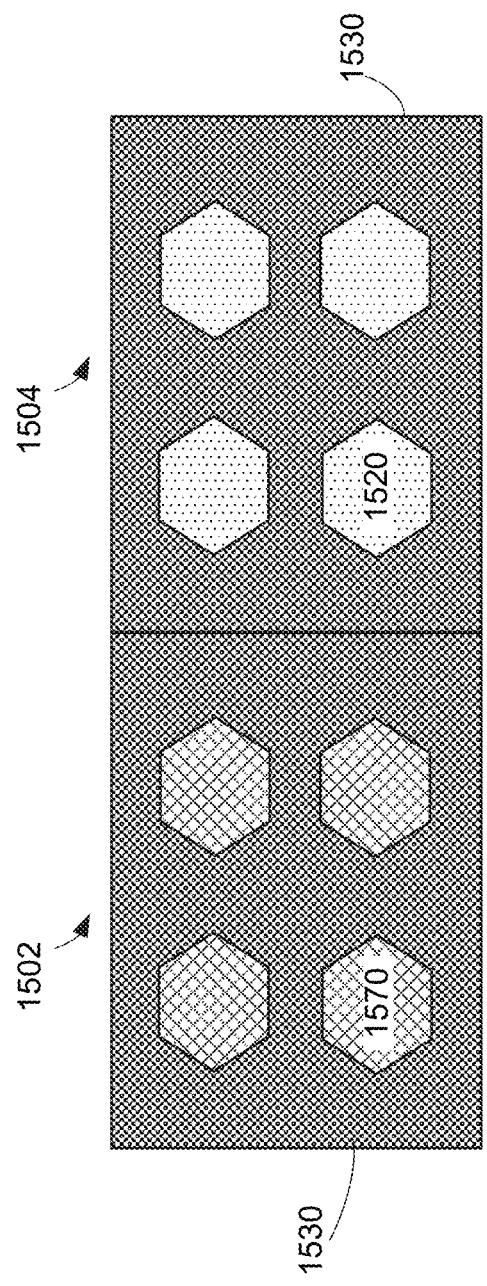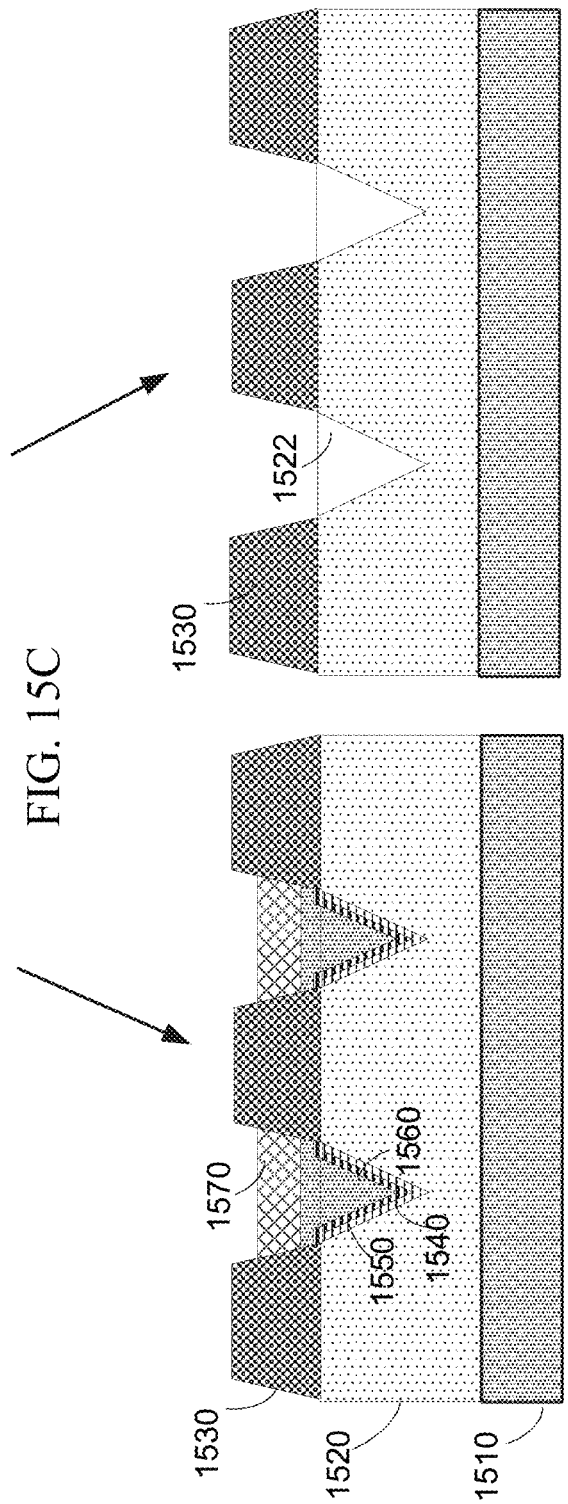
FIG. 15C
FIG. 15D
FIG. 15E

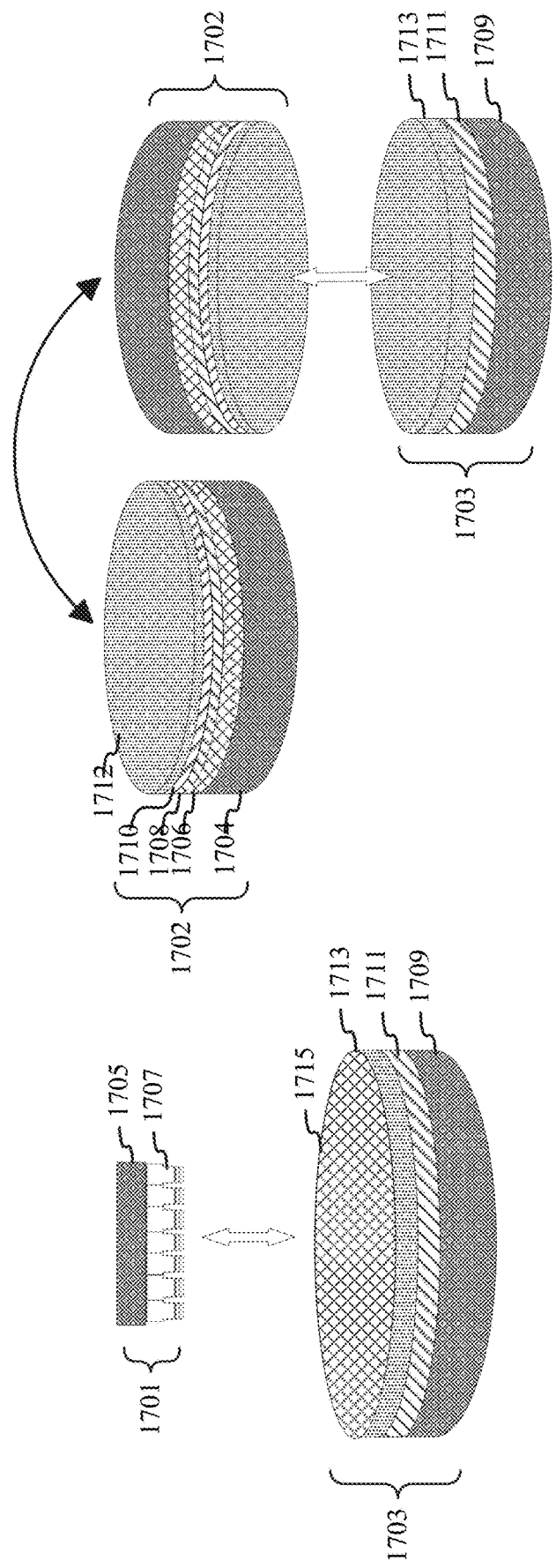

SEMIPOLAR MICRO-LED

BACKGROUND

Light-emitting diodes (LEDs) convert electrical energy into optical energy, and offer many benefits over other light sources, such as reduced size, improved durability, high brightness, and increased efficiency. LEDs can be used as light sources in many display systems, such as televisions, computer monitors, laptop computers, tablets, smartphones, projection systems, and wearable electronic devices. Micro-LEDs ("µLEDs") based on III-V semiconductors, such as alloys of AlN, GaN, InN, AlGaInP, other quaternary phosphide compositions, and the like, have begun to be developed for various display applications due to their small size (e.g., with a linear dimension less than 100 µm, less than 50 µm, less than 10 µm, or less than 5 µm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro light-emitting diodes (micro-LEDs). More specifically, this disclosure relates to high-efficiency micro-LEDs with light-emitting layers formed on semipolar facets of pits formed in a semiconductor material layer. According to certain embodiments, an LED may include an n-type semiconductor layer including a pit structure formed therein, active layers grown only on sidewalls of the pit structure and configured to emit light, and a p-type semiconductor layer on the active layers and at least partially in the pit structure. The pit structure may be characterized by a shape of an inverted pyramid (or an inverted truncated pyramid). In some embodiments, a base of the inverted pyramid may be characterized by a shape of a polygon, and each edge of the polygon may be at an intersection of a c-plane and an m-plane of the n-type semiconductor layer.

In some embodiments of the LED, the pit structure may be characterized by a maximum horizontal linear dimension less than about 500 nm. In some embodiments, an angle between a sidewall of the pit structure and a c-plane of the n-type semiconductor layer may be between about 50° and about 75°, such as between about 58° and about 66°. In some embodiments, the active layers may include GaN barrier layers and one or more InGaN quantum well layers. In some embodiments, the LED may also include an electron blocking layer between the active layers and the p-type semiconductor layer.

According to certain embodiments, a light source may include an array of light-emitting diodes (LEDs). Each LED of the array of LED may include an n-type semiconductor layer including a pit structure formed therein, active layers grown only on sidewalls of the pit structure and configured to emit light, and a p-type semiconductor layer on the active layers and at least partially in the pit structure. In some embodiments, a base of the pit structure may be characterized by a shape of a polygon, and each edge of the polygon may be at an intersection of a c-plane and an m-plane of the n-type semiconductor layer.

In some embodiments of the light source, a base of the pit structure may be characterized by a maximum horizontal linear dimension less than about 500 nm. An angle between a sidewall of the pit structure and a c-plane of the n-type semiconductor layer may be between about 50° and about 75°, such as between about 58° and about 66°. In some embodiments, each LED of the array of LEDs may also include a p-contact coupled to the p-type semiconductor layer of the LED, a conductive mirror coupled to the p-contact, and a bonding pad electrically coupled to the conductive mirror and the p-contact. The p-contacts, the conductive mirrors, and the bonding pads of a group of LEDs in the array of LEDs may be electrically connected to form a single pixel. In some embodiments, the light source may also include a backplane including drive circuits and metal bonding pads formed thereon, where the bonding pads of a group of LEDs in the array of LEDs may be electrically connected to a same metal bonding pad of the metal bonding pads on the backplane. In some embodiments, a first group of LEDs in the array of LEDs may be configured to emit visible light in a first wavelength range, and a second group of LEDs in the array of LEDs may be configured to emit visible light in a second wavelength range. In some embodiments, a third group of LEDs in the array of LEDs may be configured to emit visible light in a third wavelength range.

According to certain embodiments, a method may include forming a plurality of pit structures in a first doped semiconductor layer, growing active layers on only sidewalls of the pit structures using a first mask layer, and growing a second doped semiconductor layer on the active layers. The active layers may be configured to emit light. The second doped semiconductor layer may be at least partially in the plurality of pit structures.

In some embodiments, forming the plurality of pit structures in the first doped semiconductor layer may include forming an etch mask layer on the first doped semiconductor layer, and etching the first doped semiconductor layer using the etch mask layer to form the pit structures in the first doped semiconductor layer. The etch mask layer may include an array of apertures. Sidewalls of each aperture of the array of apertures may be slanted with respect to a c-plane of the first doped semiconductor layer. Each aperture of the array of apertures may be characterized by a circular or polygonal shape, where edges of the polygonal shape may be at intersections of the c-plane and m-planes of the first doped semiconductor layer.

In some embodiments, forming the plurality of pit structures in the first doped semiconductor layer may include forming a second mask layer on a substrate or a buffer layer and growing the first doped semiconductor layer through the array of apertures. The second mask layer may include an array of apertures. Each aperture of the array of apertures may be characterized by a circular or polygonal shape. Edges of the polygonal shape may be at intersections between the c-plane and m-planes of the substrate or the buffer layer. Sidewalls of semiconductor structures grown through the array of apertures may form the plurality of pit structures.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments.

FIG. 5B illustrates an example of a near-eye display device including a waveguide display according to certain embodiments.

FIGS. 11A-11J illustrate an example of a process of fabricating micro-LED pixels of FIGS. 10A and 10B according to certain embodiments.

FIGS. 13A-13D illustrate an example of a process of fabricating micro-LED pixels with light-emitting layers regrown on semipolar facets of pit structures formed by overgrowth according to certain embodiments.

FIGS. 15A-15G illustrate an example of a process of fabricating multi-color micro-LED pixels with light-emitting layers grown on semipolar facets of pit structures formed in a semiconductor material layer according to certain embodiments.

FIG. 17A illustrates an example of a method of die-to-wafer bonding for arrays of LEDs according to certain embodiments.

FIG. 17B illustrates an example of a method of wafer-to-wafer bonding for arrays of LEDs according to certain embodiments.

Figure 1:
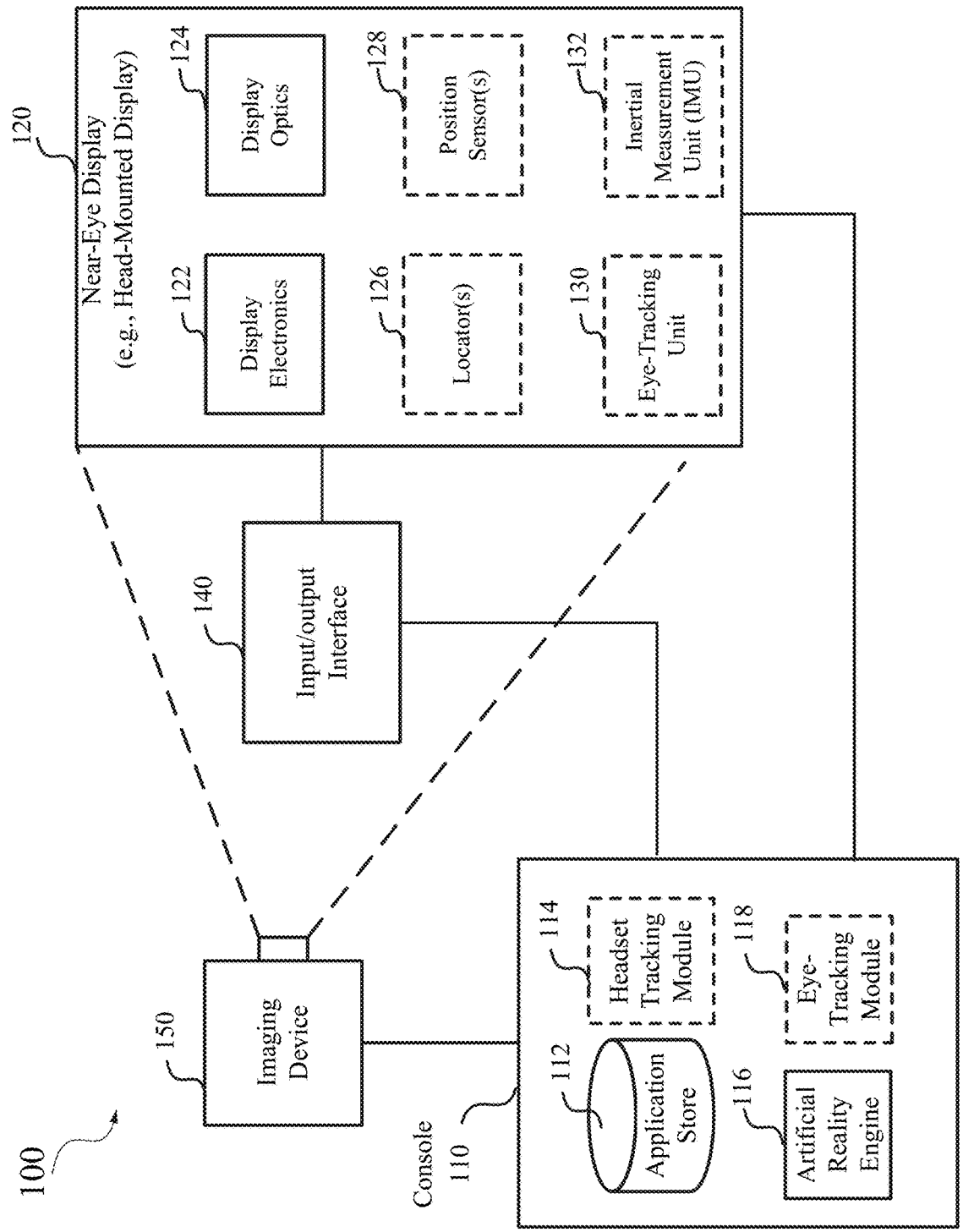
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light-emitting diodes (LEDs). More specifically, and without limitation, techniques disclosed herein relate to high-efficiency micro-LEDs with light-emitting layers formed on semipolar facets of pit structures formed in a semiconductor material layer. Various inventive embodiments are described herein, including devices, systems, wafers, bonded wafer/die stacks, packages, methods, processes, materials, and the like.

In semiconductor LEDs, photons are generated through the recombination of electrons and holes within an active region (e.g., one or more semiconductor layers that may form one or more quantum wells). The internal quantum efficiency (IQE) of an LED is the ratio between the number of photons emitted and the number of carriers (electrons and holes) injected in the active region. The generated light may be extracted from the LED in a particular direction or within a particular solid angle. The ratio between the number of emitted photons extracted from the LED and the number of electrons passing through the LED is referred to as the external quantum efficiency (EQE), which describes how efficiently the LED converts injected electrons to photons that are extracted from the LED. For LEDs, and in particular, micro-LEDs with reduced physical dimensions, the internal and external quantum efficiencies may be very low.

The quantum efficiency of LEDs depends on the relative rates of competitive radiative (light producing) recombination and non-radiative (lossy) recombination that occur in the active region of the LEDs. Non-radiative recombination processes in the active region include Shockley-Read-Hall (SRH) recombination at defect sites and electron-electron-hole (eeh) and/or electron-hole-hole (ehh) Auger recombination. Sidewalls of mesa structures etched in a semiconductor layers to form individual LEDs may have high defect densities due to the etching, such as unsatisfied bonds, chemical contamination, and structural damages (e.g., when dry-etched), which may decrease the internal quantum efficiency of the LED. For example, at the sidewall facets, the atomic lattice structure of the semiconductor layers may end abruptly, where some atoms of the semiconductor materials may lack neighbors to which bonds may be attached. This results in "dangling bonds," which may be characterized by unpaired valence electrons. These dangling bonds can create energy levels that otherwise would not exist within the bandgap of the semiconductor material, causing non-radiative electron-hole recombination at or near the sidewalls of the mesa structures. Thus, these imperfections may become the recombination centers where electrons and holes may be confined until they combine non-radiatively. Therefore, the non-radiative recombination rate may be high at the mesa sidewalls. The Auger recombination is a non-radiative process involving three carriers, which affects all sizes of LEDs. The non-radiative Auger recombination may increase at a higher rate ($\propto N^3$) than the radiative recombination ($\propto N^2$) when the charge carrier density N is sufficiently high.

For small LEDs, such as micro-LEDs, because the lateral size of each micro-LED may be comparable to the minority carrier diffusion length, a larger proportion of the total active region may be within a distance less than the minority carrier diffusion length from the LED sidewall surfaces where the defect density and the defect-induced non-radiative recombination rate may be high. Therefore, a larger proportion of the injected carriers may diffuse to the regions near the sidewall surfaces, where the injected carriers may be subjected to a higher SRH recombination rate. This may cause the efficiency of the LED to decrease (in particular, at low current injection), cause the peak efficiency of the LED to decrease, and/or cause the peak efficiency operating current to increase. Increasing the current injection to operate closer to the peak efficiency may cause the efficiencies of the micro-LEDs to drop, for example, due to the higher eeh or ehh Auger recombination rate at a higher current density. As the physical size of LEDs is further reduced to, for example, a few microns, efficiency losses due to surface recombination near the etched mesa sidewalls that include surface imperfections may become much more significant.

In addition, LEDs grown on a c-plane of a substrate or a buffer layer generally have large internal fields in the quantum-well light-emitting layers. The internal fields may include polarization-induced (including strain-induced piezoelectric polarization and spontaneous polarization) electrical field and the built-in depletion field of a p-n junction. The internal fields may contribute to quantum-confined Stark effect (QCSE) in the LEDs, which is often associated with a reduction in radiative efficiency and a blue-shift in the emission spectrum when current is injected into the LEDs, neither of which is desirable for display applications. Therefore, small micro-LEDs formed by growing epitaxial layers on the c-plane of a substrate and etching the epitaxial layers to form individual micro-LEDs may have low IQEs and other undesired effects.

According to certain embodiments, micro-LED pixels disclosed herein may include light-emitting layers grown on semipolar facets of pit structures (e.g., pyramid-shaped pits) formed in a doped semiconductor layer (e.g., an n-doped or p-doped III-V semiconductor material layer, such as an n-doped GaN layer). The pit structures may be formed in the doped semiconductor layer by etching the doped semiconductor layer using a mask with apertures having slanted sidewalls and certain shapes and orientations, or by overgrowing the doped semiconductor layer on a substrate (or a buffer layer) through a mask having small apertures. In one example, the doped semiconductor layer may include an n-doped GaN layer grown on a c-plane oriented substrate, and may be etched to form pit structures with facets tilted at an angle between about 50° and 75° with respect to the c-plane, such as at about 58° on the (11$\bar{2}$2) s2-plane or about 62° on the (10$\bar{1}$1) s5-plane. Thus, each pit structure may have an inverted pyramid shape (or a V shape in a cross-sectional view), and the facets of the pit structure may be semipolar oriented. One or more quantum well layers (e.g., undoped or unintentionally doped GaN/InGaN layers) may be epitaxially grown on the semipolar pit facets, an electron blocking layer (EBL) may be grown on the quantum well layers, and a p-doped GaN layer may be grown on the EBL layer and/or may fill the pit structure. A such, a micro-LED subpixel may be formed in each pit structure. P-contact layers, such as an indium tin oxide (ITO) layer and/or a metal layer may be formed on the p-doped GaN layer. The fabricated micro-LED wafer with micro-LED subpixels formed in the pit structure may be bonded to a CMOS wafer with bonding pads. Each bonding pad may be larger than the size of a micro-LED subpixel and thus may group multiple micro-LED subpixels into one micro-LED pixel. In some embodiments, different regions of the micro-LED wafer may be separately etched and epitaxially grown to form light-emitting layers of different materials or different compositions to emit light of different colors.

Because the light-emitting layers are grown on semipolar planes and there may not be etching of the light-emitting layers after the growth (and thus no etched sidewalls of the light-emitting layers with high defect densities), the internal quantum efficiencies of the micro-LED pixels may be high. In addition, the light-emitting layers grown on the semipolar facets of pit structures may have a light-emitting area greater than a lateral area of the pit structure, and thus may have a lower effective carrier density and a lower Auger recombination rate in the light-emitting region. Furthermore, the LED wafer may include an array of micro-LED subpixels each formed in a pit structure, and may be bonded to a CMOS backplane without alignment to form an array of micro-LED pixels each including multiple micro-LED subpixels bonded to a same bonding pad on the CMOS backplane. Therefore, the bonding process may be relatively easy and more reliable. Moreover, growing light-emitting layers on certain semipolar facets may more reliably incorporate more indium in the InGaN layers before stacking faults may be formed, such that high quality (e.g., low strain and low defect density) InGaN layers with a higher indium concentration (and thus a lower bandgap) may be grown on the semipolar facets of the pit structures, thereby increasing the wavelength of the light emitted by the LED (e.g., from blue light to green and/or red light). Therefore, a large red-shift of the wavelength of the emitted light and a high quantum efficiency may be achieved by the micro-LED pixels disclosed herein.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light-emitting diode (LED)" refers to a light source that includes at least an n-type semiconductor layer, a p-type semiconductor layer, and a light-emitting region (i.e., active region) between the n-type semiconductor layer and the p-type semiconductor layer. The light-emitting region may include one or more semiconductor layers that form one or more heterostructures, such as quantum wells. In some embodiments, the light-emitting region may include multiple semiconductor layers that form one or more multiple-quantum-wells (MQWs), each including multiple (e.g., about 2 to 6) quantum wells.

As used herein, the term "micro-LED" or "μLED" refers to an LED with a linear dimension of the chip less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs. As used herein, a micro-LED pixel may refer to an independently controlled pixel for image display, and may include multiple light-emitting structures (referred to as subpixels) that share the same anode and the same cathode.

As used herein, the term "LED array precursor" refers to an LED die or wafer that does not have the opposing electrical contacts and/or the associated driver circuitry for each LED such that a driving voltage or current may be applied to the LED for the LED to emit light. For example, an LED array precursor may be a wafer or die with an epitaxial layer stack that may or may not include the light-emitting regions, a wafer or die with mesa structures formed in the epitaxial layer stack, a wafer or die with LED arrays and metal contacts formed thereon but without the driver circuitry, and the like. Accordingly, the LED die or wafer is a precursor to a monolithic LED array that may be formed after subsequent processing steps are performed, such as forming mesa structures, forming metal electrodes, bonding to electrical backplane, removing the substrate, forming light-extraction structures, or the like.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light-emitting diode (OLED) display, an inorganic light-emitting diode (ILED) display, a micro light-emitting diode (μLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light-emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
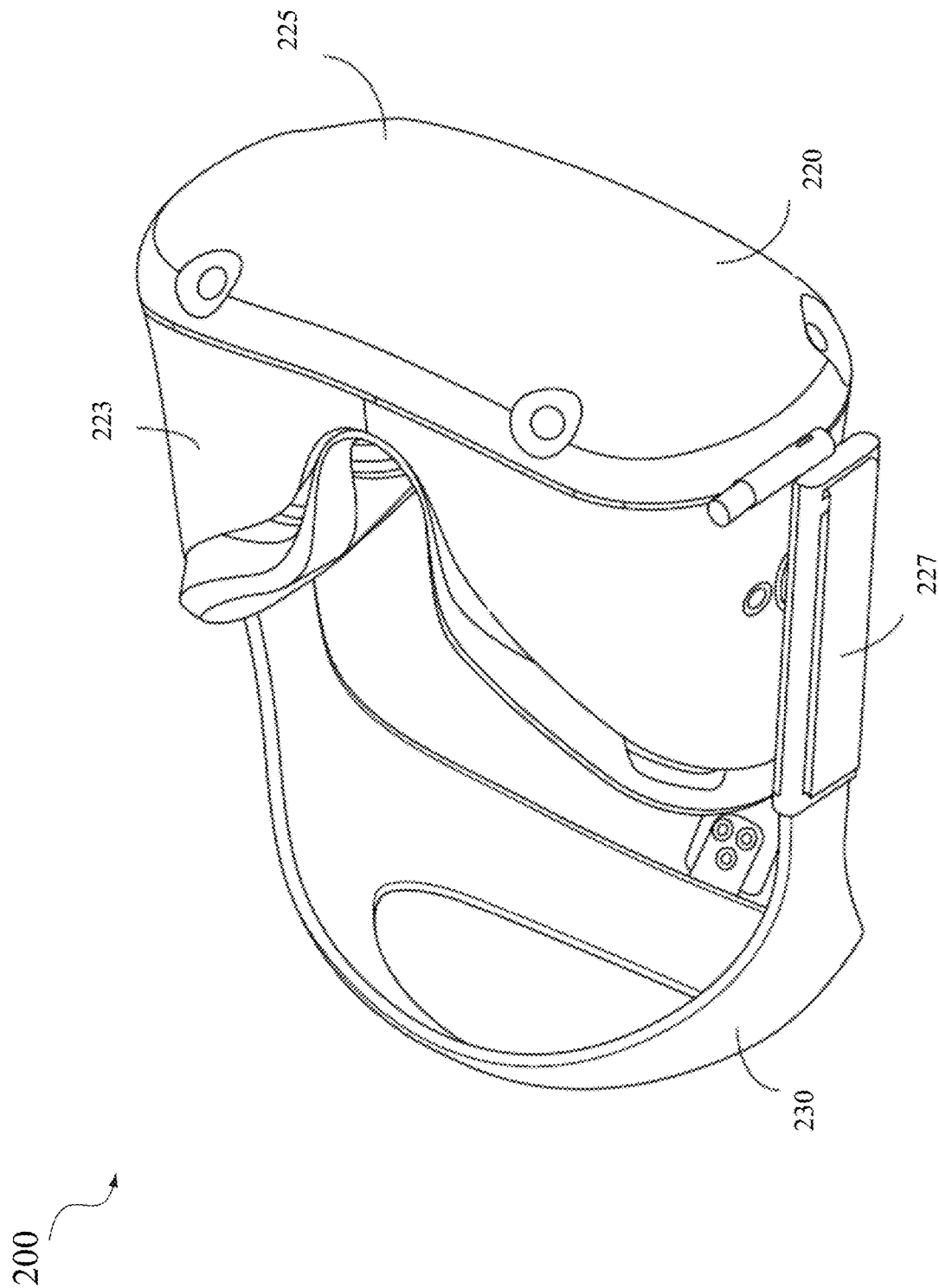
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
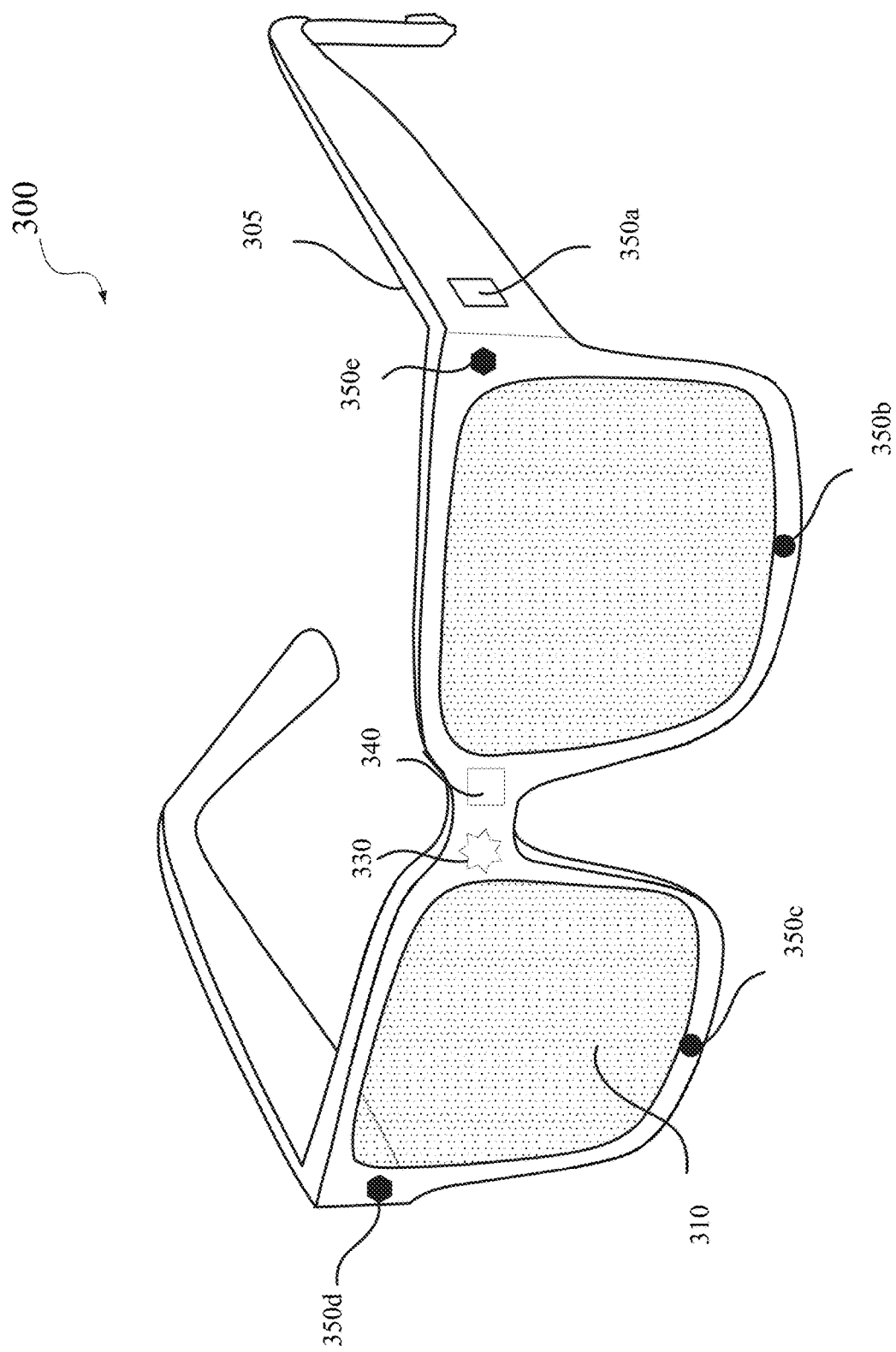
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
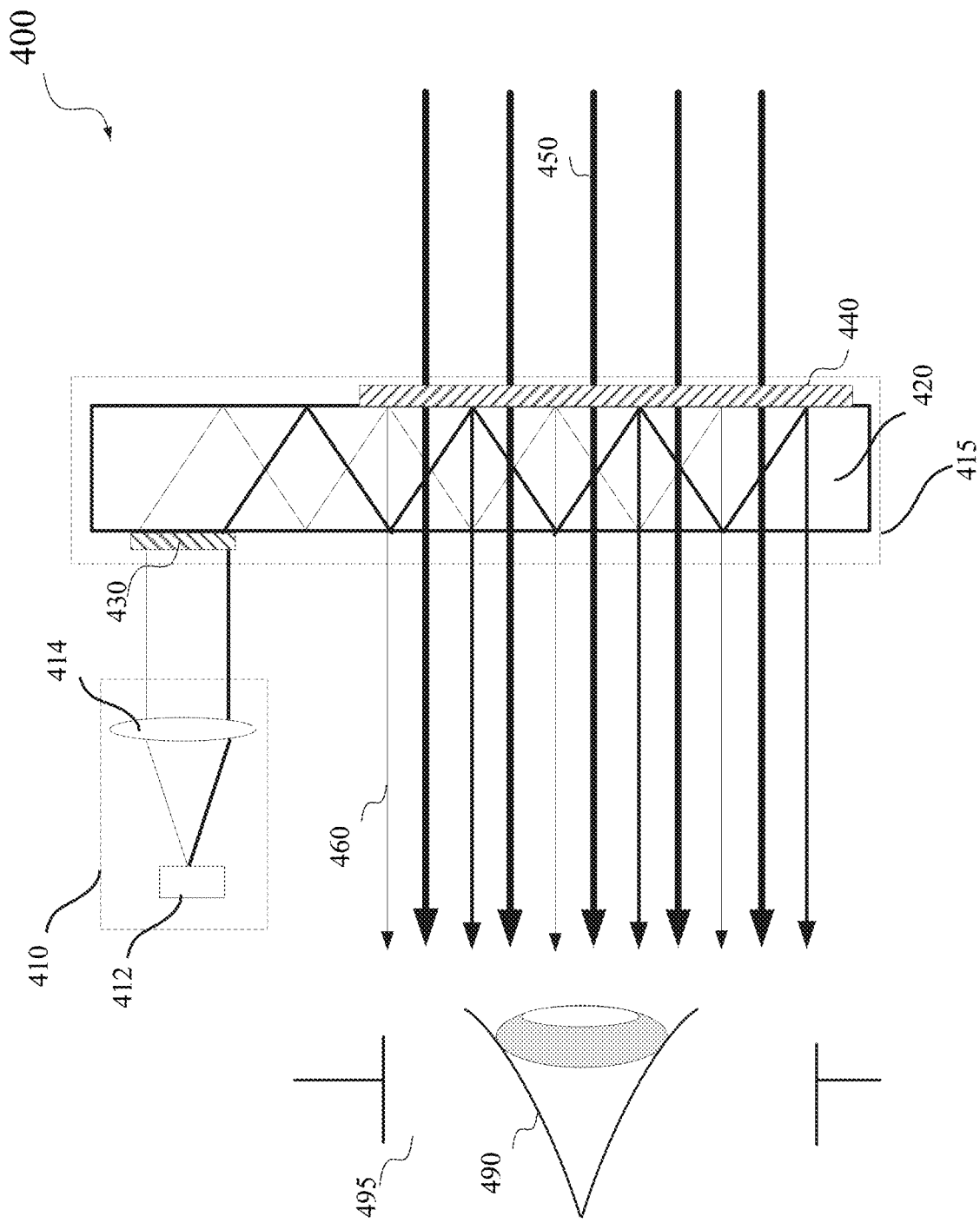
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
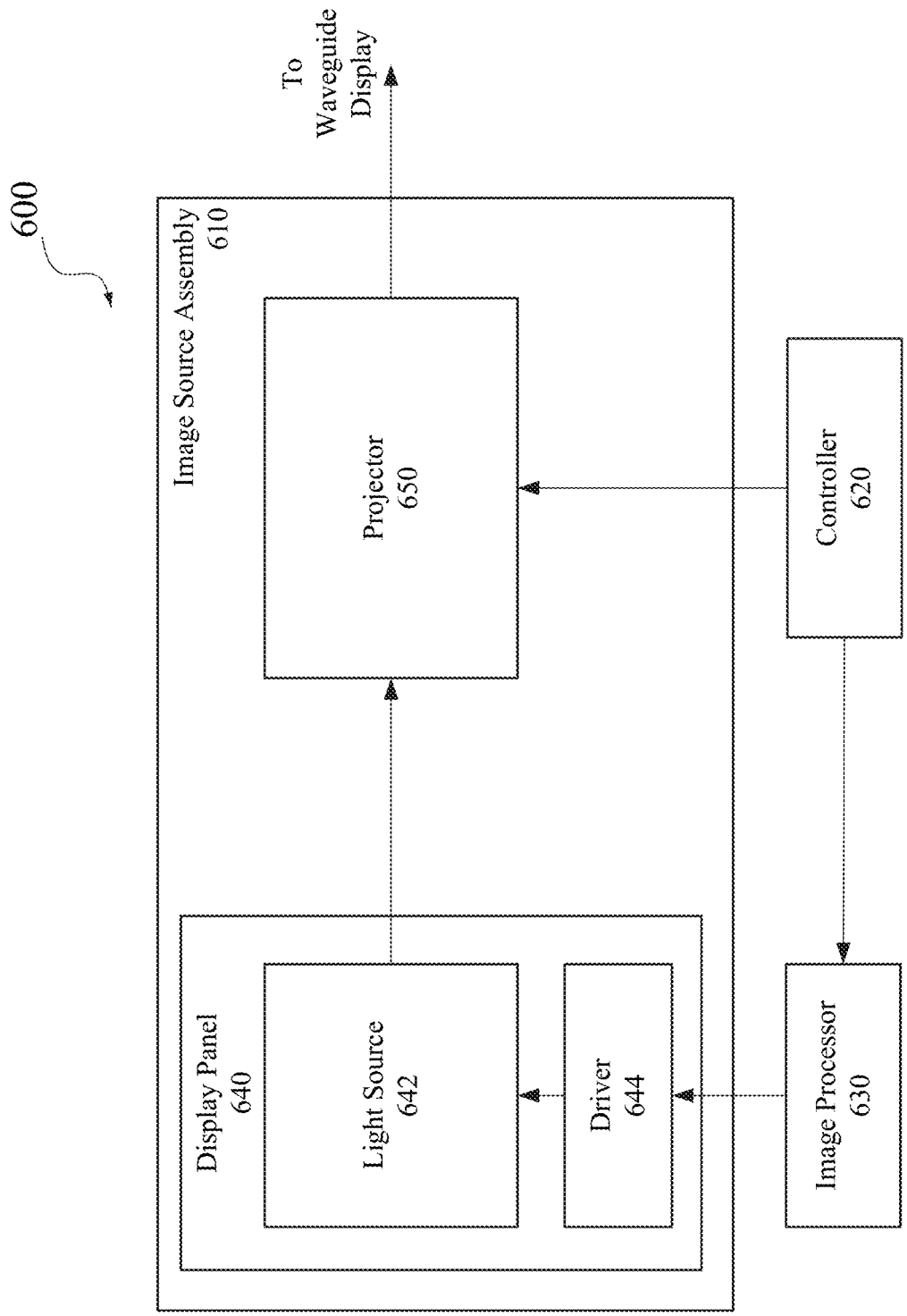
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light-emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

As described above, in semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The overall efficiency of a photonic integrated circuit or a waveguide-based display (e.g., in augmented reality system 400 or NED device 500 or 550) may be a product of the efficiency of individual components and may also depend on how the components are connected. For example, the overall efficiency $\eta_{tot}$ of the waveguide-based display in augmented reality system 400 may depend on the light-emitting efficiency of image source 412, the light coupling efficiency from image source 412 into combiner 415 by projector optics 414 and input coupler 430, and the output coupling efficiency of output coupler 440, and thus may be determined as:

$$\eta_{tot} = \eta_{EQE} \times \eta_{in} \times \eta_{out}, \qquad (1)$$

where $\eta_{EQE}$ is the external quantum efficiency of image source 412, $\eta_{in}$ is the in-coupling efficiency of light from image source 412 into the waveguide (e.g., substrate 420), and $\eta_{out}$ is the outcoupling efficiency of light from the waveguide towards the user's eye by output coupler 440. Thus, the overall efficiency $\eta_{tot}$ of the waveguide-based display can be improved by improving one or more of $\eta_{EQE}$, $\eta_{in}$, and $\eta_{out}$.

The optical coupler (e.g., input coupler 430 or coupler 532) that couples the emitted light from a light source to a waveguide may include, for example, a grating, a lens, a micro-lens, a prism. In some embodiments, light from a small light source (e.g., a micro-LED) can be directly (e.g., end-to-end) coupled from the light source to a waveguide, without using an optical coupler. In some embodiments, the optical coupler (e.g., a lens or a parabolic-shaped reflector) may be manufactured on the light source.

The light sources, image sources, or other displays described above may include one or more LEDs. For example, each pixel in a display may include three subpixels that include a red micro-LED, a green micro-LED, and a blue micro-LED. A semiconductor light-emitting diode generally includes an active light-emitting layer within multiple layers of semiconductor materials. The multiple layers of semiconductor materials may include different compound materials or a same base material with different dopants and/or different doping densities. For example, the multiple layers of semiconductor materials may generally include an n-type material layer, an active layer that may include hetero-structures (e.g., one or more quantum wells), and a p-type material layer. The multiple layers of semiconductor materials may be grown on a surface of a substrate having a certain orientation.

Photons can be generated in a semiconductor LED (e.g., a micro-LED) at a certain internal quantum efficiency through the recombination of electrons and holes within the active layer (e.g., including one or more semiconductor layers). The generated light may then be extracted from the LEDs in a particular direction or within a particular solid angle. The ratio between the number of emitted photons extracted from the LED and the number of electrons passing through the LED is referred to as the external quantum efficiency, which describes how efficiently the LED converts injected electrons to photons that are extracted from the device. The external quantum efficiency may be proportional to the carrier injection efficiency (CIE), the internal quantum efficiency (IQE), and the light extraction efficiency (LEE). The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency can be challenging. In some embodiments, to increase the light extraction efficiency, a mesa that includes at least some of the layers of semiconductor materials may be formed.

Figure 7A:
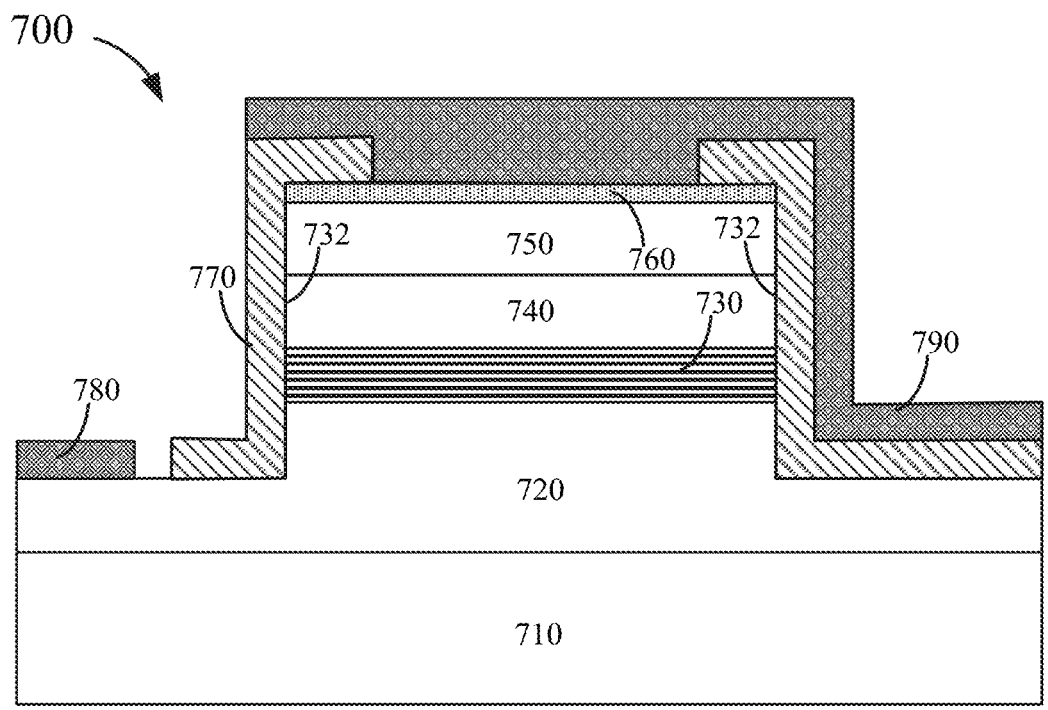
FIG. 7A illustrates an example of a light-emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light-emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light-emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light-emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a P$^+$ or P$^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a SiO$_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
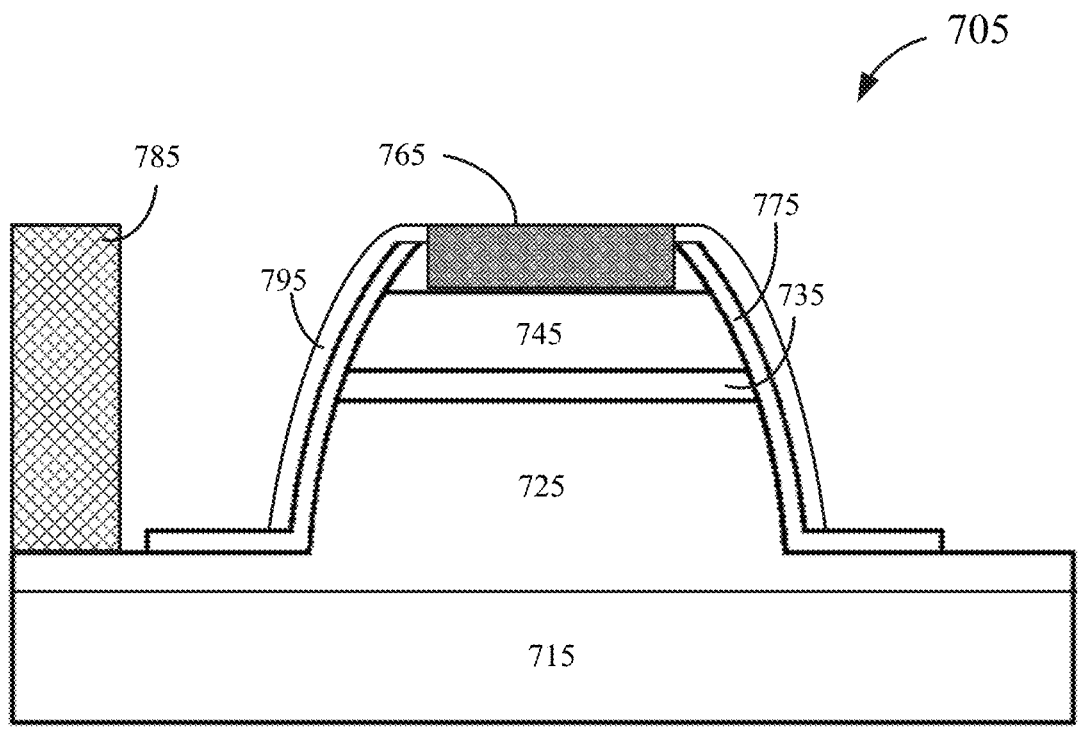
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., SiO$_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

When the mesa structure is formed (e.g., etched), the facets of the mesa structure, such as mesa sidewalls 732, may include some imperfections, such as unsatisfied bonds, chemical contamination, and structural damages (e.g., when dry-etched), that may decrease the internal quantum efficiency of the LED. For example, at the facets, the atomic lattice structure of the semiconductor layers may end abruptly, where some atoms of the semiconductor materials may lack neighbors to which bonds may be attached. This results in "dangling bonds," which may be characterized by unpaired valence electrons. These dangling bonds create energy levels that otherwise would not exist within the bandgap of the semiconductor material, causing non-radiative electron-hole recombination at or near the facets of the mesa structure. Thus, these imperfections may become the recombination centers where electrons and holes may be confined until they combine non-radiatively.

As described above, the internal quantum efficiency is the proportion of the radiative electron-hole recombination that emits photons in the active region. The internal quantum efficiency of LEDs depends on the relative rates of competitive radiative (light producing) recombination and non-radiative (lossy) recombination that occur in the active region of the LEDs. Non-radiative recombination processes in the active region may include Shockley-Read-Hall (SRH) recombination at defect sites and eeh/ehh Auger recombination, which is a non-radiative process involving three carriers. The internal quantum efficiency of an LED may be determined by:

$$IQE = \frac{BN^2}{AN + BN^2 + CN^3}, \quad (2)$$

where A, B, and C are the rates of SRH recombination, bimolecular (radiative) recombination, and Auger recombination, respectively, and N is the charge-carrier density (or charge-carrier concentration) in the active region.

Figure 8:
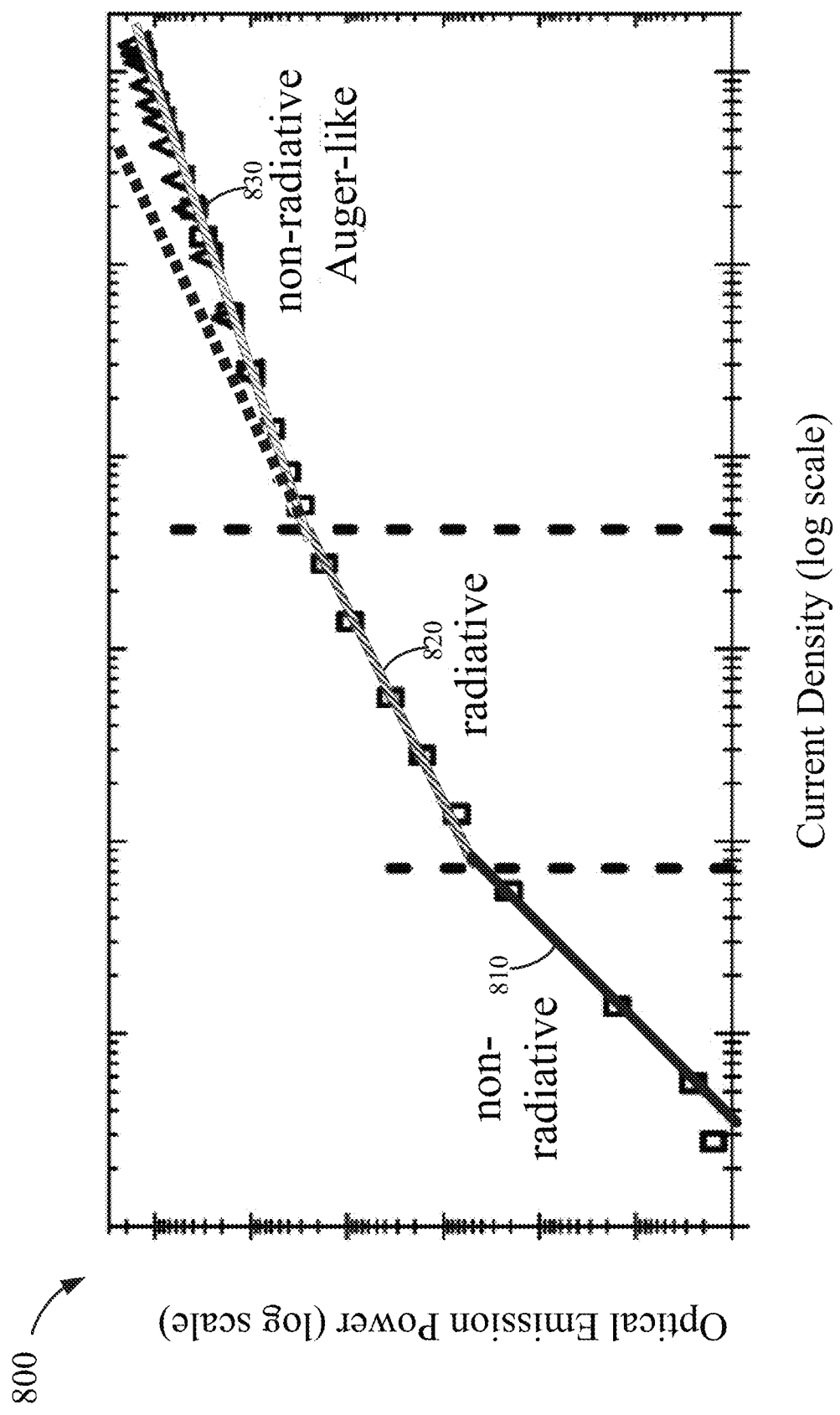
FIG. 8 illustrates the relationship between the optical emission power and the current density of a light-emitting diode.

FIG. 8 illustrates the relationship between the optical emission power and the current density of a light-emitting diode. As illustrated by a curve 810 in FIG. 8, the optical emission power of a micro-LED device may be low when the current density (and thus the charge carrier density N) is low, where the low external quantum efficiency may be caused by the relatively high non-radiative SRH recombination when the charge carrier density N is low (and thus $N^2$ and $N^3$ are small) according to equation (2). As the current density (and thus the charge carrier density N) increases, the optical emission power may increase as shown by a curve 820 in FIG. 8, because the radiative recombination may increase at a higher rate ($\propto N^2$) than the non-radiative SRH recombination ($\propto N$) when the charge carrier density N is high, according to equation (2). As the current density increases further, the optical emission power may increase at a slower rate as shown by a curve 830 in FIG. 8 and thus the external quantum efficiency may drop because, for example, the non-radiative Auger recombination may increase at a higher rate ($\propto N^3$) than the radiative recombination ($\propto N^2$) when the charge carrier density N is sufficiently high, according to equation (2).

Auger recombination is a non-radiative process involving three carriers. Auger recombination may be a major cause of efficiency droop and may be direct or indirect. For example, direct Auger recombination may occur when an electron and a hole recombine, but instead of producing light, either an electron is raised higher into the conduction band or a hole is pushed deeper into the valence band. Auger recombination may be reduced to mitigate the efficiency droop by lowering the charge-carrier density N in the active region for a given injection current density J, which may be written as:

$$J = qd_{eff}(AN + BN^2 + CN^3), \quad (3)$$

where $d_{eff}$ is the effective thickness of the active region. Thus, according to equation (3), the effect of the Auger recombination may be reduced and thus the IQE of the LED may be improved by reducing the charge-carrier density N for a given injection current density, which may be achieved by increasing the effective thickness of the active region $d_{eff}$. The effective thickness of the active region may be increased by, for example, growing multiple quantum wells (MQWs). Alternatively, an active region including a single thick double heterostructure (DH) may be used to increase the effective thickness of the active region.

While the Auger recombination due to a high current density (and high charge carrier density) may be an intrinsic process depending on material properties, non-radiative SRH recombination may depend on the characteristics and quality of the material at the active region, such as the defect density in the active region. As described above with respect to FIGS. 7A and 7B, LEDs may be fabricated by etching through the active light-emitting layers to form individual mesa structures and confine carriers within the individual mesa structures, and to expose the n-type material beneath the active light-emitting layers for electrical contact. Etching the mesa structures may lead to the formation of mesa sidewalls that are approximately orthogonal to the growth plane or slightly tilted with respect to the surface-normal direction of the growth plane. Due to the etching, the active region in proximity to the exposed sidewalls may have a higher density of defects, such as dislocations, dangling bonds, pores, grain boundaries, vacancies, inclusion of precipitates, impurities, and the like. The defects may introduce energy states having deep or shallow energy levels in the bandgap. Carriers may be trapped by these energy states until they combine non-radiatively. Therefore, the active region in proximity to the exposed sidewalls may have a higher rate of SRH recombination than the bulk region that is far from the sidewalls.

Parameters that may affect the impact on the LED efficiency by the non-radiative surface recombination may include, for example, the surface recombination velocity (SRV) S, the carrier diffusion coefficient (diffusivity) D, and the carrier lifetime $\tau$. The high recombination rate in the vicinity of the sidewall surfaces due to the high defect density may depend on the number of excess carriers (in particular, the minority carriers) in the region. The high recombination rate may deplete the carriers in the region. The depletion of the carriers in the region may cause carriers to diffuse to the region from surrounding regions with higher carrier concentrations. Thus, the amount of surface recombination may be limited by the surface recombination velocity S at which the carriers move to the regions near the sidewall surfaces. The carrier lifetime r is the average time that a carrier can spend in an excited state after the electron-hole generation before it recombines with another carrier. The carrier lifetime $\tau$ generally depends on the carrier concentration and the recombination rate in the active region. The carrier diffusion coefficient (diffusivity) D of the material and the carrier lifetime $\tau$ may determine the carrier diffusion length $L=\sqrt{D \times \tau}$, which is the average distance a carrier can travel from the point of generation until it recombines. The carrier diffusion length L characterizes the width of the region that is adjacent to a sidewall surface of the active region and where the contribution of surface recombination to the carrier losses is significant. Charge carriers injected or diffused into the regions that are within a minority carrier diffusion length from the sidewall surfaced may be subject to the higher SRH recombination rate.

GaN materials may have a much lower surface recombination velocity (e.g., less than about $0.5 \times 10^5$ cm/s) than phosphide semiconductor materials such as AlGaInP material (e.g., with a surface recombination velocity about $10^6$ cm/s). In addition, nitride LEDs can operate at non-equilibrium carrier concentrations much higher than phosphide LEDs, which may result in considerably shorter carrier lifetime in nitride LEDs. Therefore, the carrier diffusion lengths in the active regions of III-nitride LEDs may be considerably shorter than the carrier diffusion lengths in phosphide LEDs. As such, III-nitride LEDs, such as InGaN micro-LEDs, may have both lower surface recombination velocities and shorter carrier diffusion lengths, and thus may have much lower surface recombination and efficiency reduction than phosphide LEDs, such as AlGaInP-based micro-LEDs.

A higher current density (e.g., in units of A/cm²) may be associated with a lower surface recombination velocity as the surface defects may be more and more saturated at higher carrier densities. Thus, the surface recombination velocity may be reduced by increasing the current density. In addition, the diffusion length of a given material may vary with the current density at which the device is operated. However, LEDs generally may not be operated at high current densities. Increasing the current injection may also cause the efficiencies of the micro-LEDs to drop due to the higher Auger recombination rate and the lower conversion efficiency at the higher temperature caused by self-heating at the higher current density.

For traditional, broad area LEDs used in lighting and backlighting applications (e.g., with a lateral device area about 0.1 mm² to about 1 mm²), the sidewall surfaces are at the far ends of the devices. The devices can be designed such that little or no current is injected into regions within a minority carrier diffusion length of the mesa sidewalls, and thus the sidewall surface area to volume ratio and the overall rate of SRH recombination may be low. However, in micro-LEDs, as the size of the LED is reduced to a value comparable to or having a same order of magnitude as the minority carrier diffusion length, the increased surface area to volume ratio may lead to a high carrier surface recombination rate, because a greater proportion of the total active region may fall within the minority carrier diffusion length from the LED sidewall surfaces. Therefore, more injected carriers are subjected to the higher SRH recombination rate. This can cause the leakage current of the LED to increase and the efficiency of the LED to decrease as the size of the LED decreases, and/or cause the peak efficiency operating current to increase as the size of the LED decreases. For example, for a larger LED with a 100 µm×100 µm×2 µm (in width× length×height) mesa, the side-wall surface area to volume ratio may be about 0.04. However, for a smaller LED with a 5 µm×5 µm×2 µm mesa, the side wall surface area to volume ratio may be about 0.8, which is about 20 times higher than the larger LED. Thus, with a similar surface defect density, the SRH recombination coefficient of the smaller LED may be about 20 times higher as well. Therefore, the efficiency of the smaller LED may be reduced significantly.

As described above with respect to, for example, FIG. 7A, an LED may include semiconductor layers epitaxially grown on a substrate, such as a sapphire substrate or a GaN substrate that has a Wurtzite hexagonal lattice. Depending on how the substrate is cut, the growth surface of the substrate may be a polar plane, a nonpolar plane, or a semipolar plane. Therefore, epitaxial layers grown on the substrate may have different orientations. Epitaxial layers with different orientations may have different growth quality, composition, and properties.

Figure 9A:
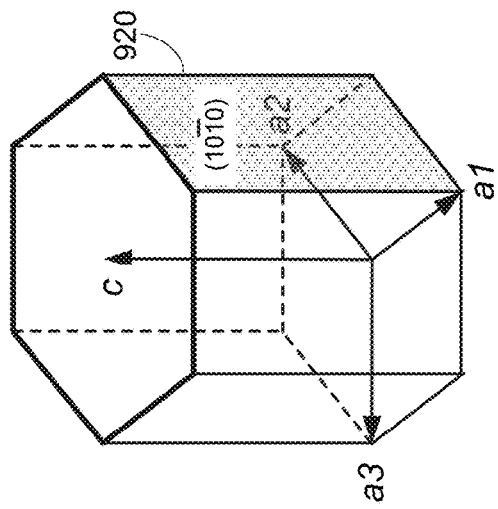
FIGS. 9A-9E illustrate various polar, nonpolar, and semipolar planes in a hexagonal crystal lattice structure of an example of a III-nitride semiconductor material.
Figure 9B:
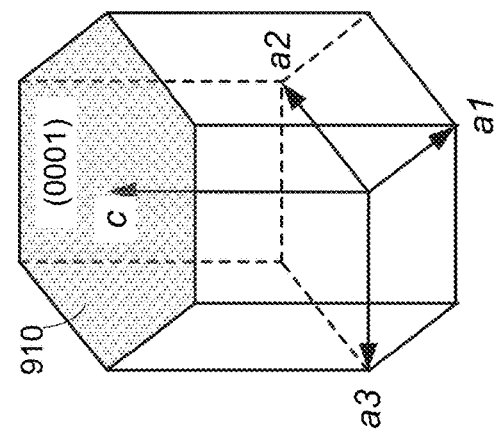

FIGS. 9A-9E illustrate various planes of the hexagonal crystal lattice structure of an example of a III-nitride semiconductor material 900 that epitaxial layers may be grown on. Semiconductor material 900 may include, for example, a sapphire substrate or a GaN substrate that has a Wurtzite hexagonal lattice as shown in the figures. The planes of a hexagonal lattice can be represented by four Miller-Bravais indices a1, a2, a3, and c as (a1, a2, a3, c), where a1+a2+a3=0. For example, a1+a2+a3=0 and c≠0 define a set of parallel planes that have different indices c along the c-axis, which are polar planes that have the maximum spontaneous polarization in the direction perpendicular to the planes as a result of unequal numbers of nitride atoms and gallium atoms in the double monolayer. An example of a c-plane 910 is shown in FIG. 9A. If index c of a plane is 0, the plane is featured by a zero polarization field in the direction perpendicular to the plane and is thus referred to as a "nonpolar" plane. An example of a nonpolar m-plane 920 is shown in FIG. 9B.

Figure 9E:
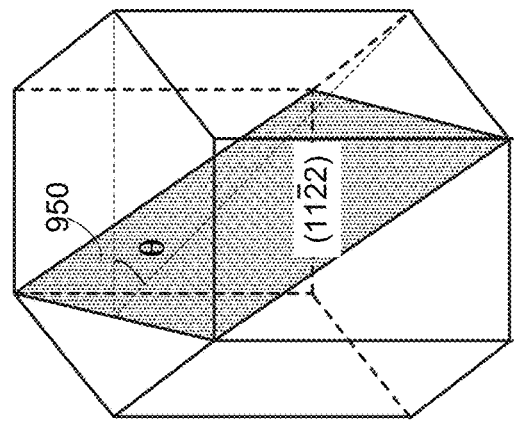
Figure 9D:
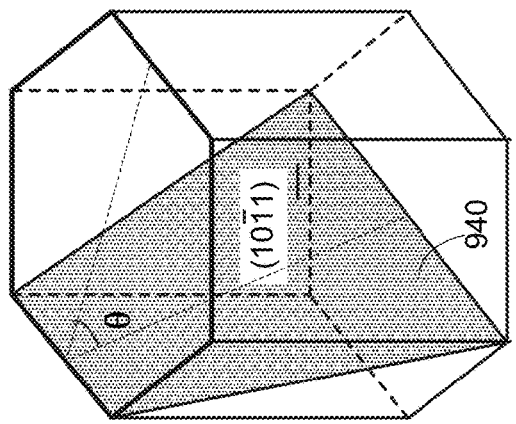
Figure 9C:
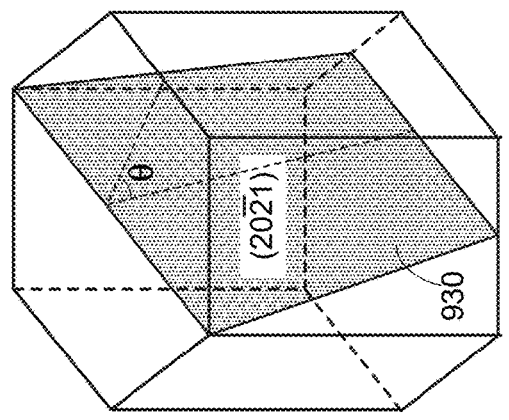

When the index c of a plane is nonzero, and any of the a1 and a2 indices of the plane is nonzero, the plane is a semi-polar plane. FIGS. 9C-9E illustrate examples of semi-polar planes in semiconductor material 900. Semi-polar plane 930 shown in FIG. 9C is the (20$\bar{2}$1) plane (also referred to as the s6-plane), which has an angle θ about 75° with respect to the c-plane. The (20$\bar{2}$1) plane may be a majority-N plane, where a majority of elements on the plane are nitrogen. Semi-polar plane 940 shown in FIG. 9D is the (10$\bar{1}$1) plane (also referred to as the s5-plane), which has an angle θ about 62° with respect to the c-plane. Semi-polar plane 950 shown in FIG. 9E is the (11$\bar{2}$2) plane (also referred to as the s2-plane), which has an angle θ about 58° with respect to the c-plane.

InGaN/GaN c-plane LED devices generally have large internal fields in the quantum-well light-emitting layers. The internal fields may include the polarization-induced internal field (e.g., caused by piezoelectric polarization and spontaneous polarization) and the built-in deletion field of the p-n junction. The field in a heterostructure of an LED device may cause the electron and hole energy levels to shift (thus changing the bandgap), which may be referred to as the Quantum-Confined Stark Effect (QCSE). The QCSE arises when a quantum-confined system is subjected to an electric field along the axis of carrier confinement. For semiconductor quantum wells, the internal field in the quantum wells may skew the potential wells, and cause the hole and electron energy levels to shift, thus decreasing the gap between these energy levels. These changes may be accompanied by a change to the exciton energy due to a reduction of the Coulombic interaction as the electrons and holes become spatially separated. The QCSE may sometimes manifest as a net decrease in the energy of the exciton and thus a red-shift of its optical emission spectrum.

In polar crystals such as GaN, the spontaneous polarization in the growth direction may be at the maximum for crystals grown on the c-plane (i.e., the polar plane). The polarization may change directions for crystals grown on planes of other orientations. Thus, the polarization in the growth direction may decrease for crystals grown on planes that have angles θ between 0° and 90° with respect to the c-plane (i.e., the semi-polar planes), and may become zero (nonpolar) for crystals grown on planes perpendicular to the polar plane (e.g., the nonpolar m-planes or a-planes). Piezoelectric polarization in InGaN/GaN structures may behave in a similar manner, and thus the piezoelectric polarization may also differ for planes with different orientations. Thus, heterostructures (e.g., quantum wells) based on these polar crystals may have a strong internal electric field induced by the piezoelectric polarization and spontaneous polarization along the most natural crystal growth direction [0001] (i.e., the c-axis). As such, carriers in heterostructures grown on the c-plane may experience a strong polarization-induced internal field in their transport direction (e.g., the heterostructure growth direction). The polarization-induced internal fields in the carrier transport direction may cause a shift of the exciton emission energy inside these heterostructures, where electrons and holes may also be shifted to opposite sides of the well and confined by the well. For example, the electron energy level in the conduction band and the hole energy level in the valence band may be tilted in the quantum well due to the electric field. Thus, more electrons may be close to the p-GaN side, and more holes may be close to the N—GaN side. This spatial separation between the electrons and holes is limited by the presence of the potential barriers around the quantum well, and may cause a drastic decrease of the spatial overlap of the electron and hole wavefunctions (and hence the overlap integral of the electron and hole wavefunctions or the effective thickness $d_{eff}$ of the active region) in the direction of the c-axis, which may in turn reduce the radiative recombination rate and thus the internal quantum efficiency of the system.

Therefore, heterostructures grown on c-plane substrates may suffer from a strong internal electric field in the carrier transport direction that is induced by the piezoelectric polarization and spontaneous polarization parallel to the most natural crystal growth direction [0001] (i.e., the c-axis). The polarization-induced electric fields in the carrier transport direction may cause a red-shift of the exciton emission energy inside these heterostructures. For example, due to the distortion of the energy bands caused by the polarization-induced internal field, the photoluminescence emission wavelength of a c-plane quantum well under zero bias may be red-shifted (i.e., having a longer wavelength and a lower energy) compared to a quantum well with no polarization effects. With increasing external bias voltage (and electrical field), the energy bands may be gradually flattened and the emission wavelength of the quantum well may blue-shift (i.e., having a shorter wavelength and a higher energy) as the internal electric fields may be at least partially screened by the injection of free carriers.

For c-plane LEDs, the blue-shift between spontaneous emission and emission in the biased condition can be significant (e.g., >30 nm). For m-plane LEDs, epitaxial growth of high-quality light-emitting material layers may be difficult. For semi-polar planes having an angle θ with respect to the c-plane between 0° and 90° (such as between about 50° and about 75° or between about 58° and about 66°), the polarization field in the growth direction (and thus QCSE) lies somewhere between these extremes. Semi-polar GaN may also be capable of accommodating sufficient stress before catastrophic morphological breakdown occurs, including the propagation of 1-D and 2-D extended defects. As such, semi-polar GaN may be capable of producing highly efficient LEDs with reduced QCSE and blue-shift.

According to certain embodiments, micro-LED pixels may be made with light-emitting layers grown on semipolar facets of pit structures (e.g., pyramid-shaped pits) formed in semiconductor layers. The pit structures may be formed in a semiconductor layer by etching the semiconductor layer (e.g., an n-doped or p-doped III-V semiconductor material layer) using a mask with apertures having slanted sidewalls and certain shapes and orientations, or by overgrowing the semiconductor layer on a substrate (or a buffer layer) through a mask having small apertures. Because the light-emitting layers are grown on semipolar planes and there may not be etching of the light-emitting layers after the growth (and thus no etched sidewalls of the light-emitting layers with high defect densities), the internal quantum efficiencies of the micro-LED pixels may be high. In addition, the light-emitting layers grown on the semipolar facets of pit structures may have a light-emitting area greater than a lateral area of the pit structure, and thus may have a lower effective carrier density and a lower Auger recombination rate in the light-emitting region. Moreover, growing light-emitting layers on certain semipolar facets may more reliably incorporate more indium in the InGaN layers before stacking faults may be formed, such that high quality (e.g., low strain and low defect density) InGaN layers with a higher indium concentration (and thus a lower bandgap) may be grown on the semipolar facets of the pit structures, thereby increasing the wavelength of the light emitted by the LED (e.g., from blue light to green and/or red light). Therefore, a large red-shift of the wavelength of the emitted light and a high quantum efficiency may be achieved by the micro-LED pixels disclosed herein.

In one example, a doped semiconductor layer, such as an n-doped GaN layer grown on a c-plane oriented substrate, may be etched to form pit structures with facets tilted at an angle between about 50° and 75° with respect to the c-plane, such as at about 58° on the (11$\bar{2}$2) s2-plane or about 62° on the (10$\bar{1}$1) s5-plane. Thus, each pit structure may have an inverted pyramid shape (or a V shape in a cross-sectional view), and the facets of the pit structure may be semipolar oriented. One or more quantum well layers (e.g., undoped or unintentionally doped GaN/InGaN layers) may be epitaxially grown on the semipolar pit facets, an electron blocking layer (EBL) may be grown on the quantum well layers, and a p-doped GaN layer may be grown on the EBL layer and/or may fill the pit structure. A such, a micro-LED subpixel may be formed in each pit structure. P-contact layers, such as an indium tin oxide (ITO) layer and/or a metal layer may be formed on the p-doped GaN layer. The fabricated micro-LED wafer with micro-LED subpixels formed in the pit structure may be bonded to a CMOS wafer with bonding pads. Each bonding pad may be larger than the size of a micro-LED subpixel and thus may group multiple micro-LED subpixels into one micro-LED pixel. In some embodiments, different regions of the micro-LED wafer may be separately etched and epitaxially grown to form light-emitting layers of different materials or different compositions to emit light of different colors.

Figure 10A:
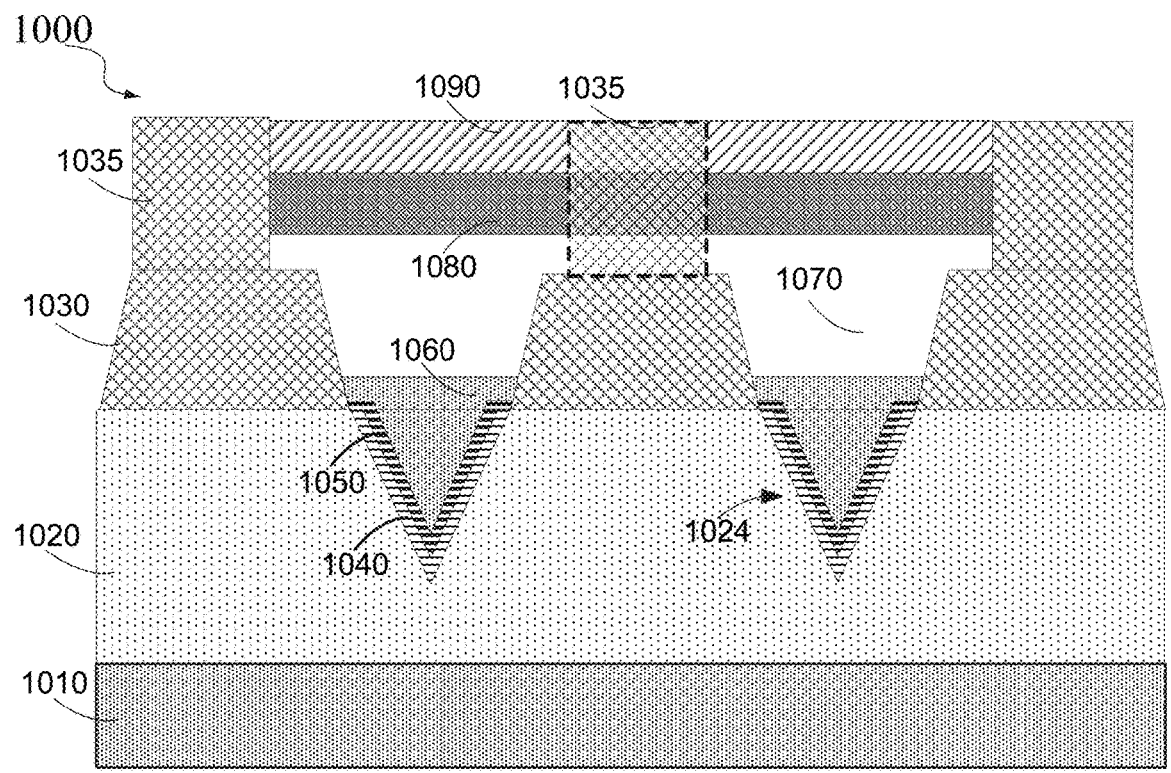
FIG. 10A illustrates an example of a micro-LED pixel including subpixels having light-emitting layers formed on semipolar facets of pits formed in a semiconductor material layer according to certain embodiments.

FIG. 10A illustrates an example of a micro-LED pixel 1000 including subpixels having light-emitting layers formed on semipolar facets of pit structures formed in a semiconductor material layer 1020 according to certain embodiments. Semiconductor material layer 1020 may include, for example, an n-doped GaN layer grown on a substrate 1010. Substrate 1010 may include a GaN substrate or a sapphire substrate with a buffer layer as described above. The n-doped GaN layer grown on substrate 1010 may be doped with, for example, Si or Ge. The top and bottom surface of semiconductor material layer 1020 may align with the c-plane of the semiconductor material (e.g., GaN). Multiple pits 1024 or other indented structures may be formed in semiconductor material layer 1020. In the illustrated example, pits 1024 may have a V shape in a cross-sectional view and may have an inverted pyramid shape in a 3-D view. Facets of the inverted pyramid shape may have an angle θ between about 50° and about 75° (e.g., between about 58° and 66°) with respect to the c-plane of semiconductor material layer 1020, such as in the (11$\bar{2}$2) s2-plane (θ at about 58°) or in the (10$\bar{1}$1) s5-plane (θ at about 62°). In one example, pits 1024 may be formed by etching semiconductor material layer 1020 using a mask layer 1030 as an etch mask layer. Mask layer 1030 may include, for example, a SiO$_2$ mask layer with polygonal (e.g., hexagonal) or circular apertures. For large pits 1024, such as pits 1024 with a maximum horizontal linear dimension greater than about 500 nm or larger, each edge of the polygon (e.g., hexagon) may be at the intersection between the c-plane and an m-plane of the six non-polar m-planes of the hexagonal crystal lattice structure shown in FIG. 9B. For small pits 1024, such as pits 1024 with a maximum horizontal linear dimension less than about 500 nm (e.g., <200 nm or <100 nm), the apertures in the SiO$_2$ mask layer may be circular or polygonal. The apertures may have slanted sidewalls with slant angles similar to the desired slant angles of the facets of pits 1024 described above.

Active layers 1040 (e.g., barrier layers and quantum well layers of multiple quantum wells or a multi-quantum well) may be epitaxially grown on the facets of pits 1024 using, for example, the MBE or MOCVD process as described above. In some embodiments, mask layer 1030 used for etching pits 1024 may also be used as an overgrowth mask layer during the growth of active layers 1040. Because semiconductor material layer 1020 is covered by mask layer 1030, active layers 1040 may only be grown inside pits 1024 and on facets of pits 1024 as shown in FIG. 10A. Active layers 1040 may have a growth surface in a semipolar plane (e.g., the (10$\bar{1}$1) s5-plane) when each edge of the polygonal (e.g., hexagonal) aperture of mask layer 1030 (and thus the bottom of the inverted pyramid-shaped pit 1024) is at the intersection between the c-plane and an m-plane of the six non-polar m-planes of the hexagonal crystal lattice structure. When pits 1024 is small, such as having a maximum horizontal linear dimension less than about 500 nm (e.g., <200 nm or <100 nm), the bottom of pits 1024 may have a circular shape or a polygonal shape, and facets of pits 1024 may be naturally reconstructed in the preferred orientations (e.g., parallel to the (10$\bar{1}$1) s5-plane) during the growth of active layers 1040.

In some embodiments, a thin electron blocking layer (EBL) 1050 may be epitaxially grown on active layers 1040. An oppositely doped semiconductor layer 1060 may be grown on active layers 1040 or EBL 1050. Semiconductor layer 1060 may be a p-type GaN layer doped with, for example, Mg, Ca, Zn, or Be. In the example shown in FIG. 10A, the oppositely doped semiconductor layer 1060 may fill the remaining regions of pits 1024 and may also be grown on top of pits 1024. Semiconductor material layer 1020, active layers 1040, and oppositely doped semiconductor layer 1060 in each pit 1024 may form a light-emitting micro-LED subpixel.

In the illustrated example, a transparent conductive oxide (TCO) layer 1070 (e.g., ITO layer) may be formed on the micro-LED subpixels to make electrical contact with, for example, the p-doped semiconductor layer of the micro-LED subpixels. A mirror layer 1080, such as a metal mirror layer (e.g., Al, Pt, Au, Ag, Ni, Ti, Cu, W, or any combination thereof, such as ITO/Ag/Pt/Au, Ag/Pt/Au, or Al/Ni/Au) or a conductive DBR mirror, may be deposited on TCO layer 1070. Mirror layer 1080 may be used to reflect light emitted in active layers 1040 to the light-emitting surface of the micro-LED subpixel. A bonding material layer 1090, such as a metal layer (e.g., Cu, Al, Au, Ni, Ti, or any combination thereof), may be formed on mirror layer 1080. TCO layer 1070, mirror layer 1080, and bonding material layer 1090 may be etched to form individual micro-LED pixels 1000 that each include multiple micro-LED subpixels connected together by portions of TCO layer 1070, mirror layer 1080, and bonding material layer 1090. The regions between micro-LED pixels 1000 may be filled with a dielectric material 1035 (e.g., SiO$_2$) to electrically isolate the individual micro-LED pixels 1000. Micro-LED pixels 1000 may be bonded to a CMOS backplane through bonding material layer 1090 as described in detail below.

In some embodiments, TCO layer 1070, mirror layer 1080, and bonding material layer 1090 for each micro-LED subpixel may be formed by depositing a dielectric layer, patterning the dielectric layer, and depositing TCO layer 1070, mirror layer 1080, and bonding material layer 1090 through the patterned dielectric layer. In some embodiments, TCO layer 1070, mirror layer 1080, and bonding material layer 1090 may be etched to form individual micro-LED subpixels with respective p-contacts, mirrors, and bonding pads, where regions between the micro-LED subpixels may be filled with dielectric material 1035 (e.g., SiO$_2$). The individual micro-LED subpixels may not be grouped on the micro-LED wafer, and may be grouped into micro-LED pixels by bonding the bonding pads of a group of micro-LED subpixels to a metal bonding pad on the CMOS backplane.

Figure 10B:
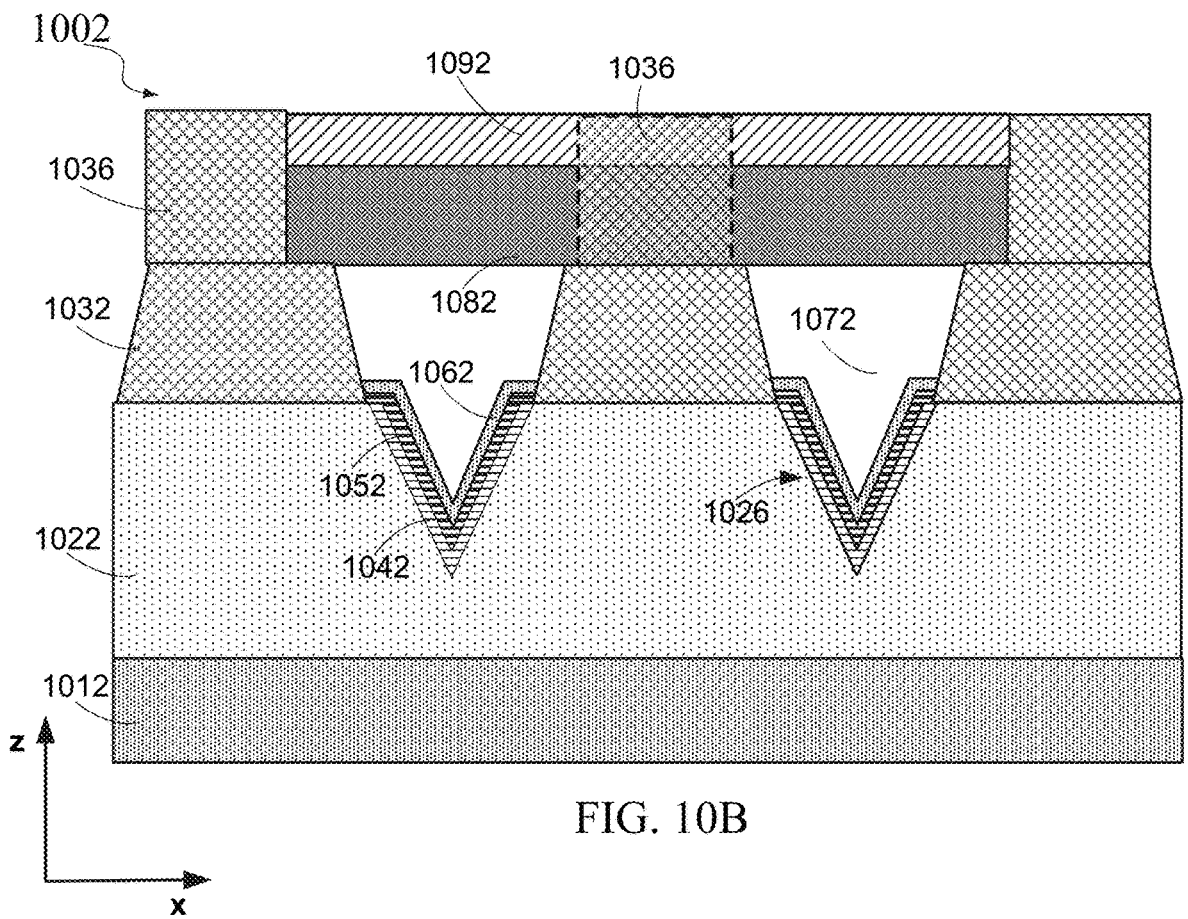
FIG. 10B illustrates another example of a micro-LED pixel including subpixels having light-emitting layers formed on semipolar facets of pits formed in a semiconductor material layer according to certain embodiments.

FIG. 10B illustrates another example of a micro-LED pixel 1002 including subpixels having light-emitting layers formed on semipolar facets of pit structures formed in a semiconductor material layer 1022 according to certain embodiments. Micro-LED pixel 1002 may be similar to micro-LED pixel 1000 and may be fabricated using similar processes and similar materials as micro-LED pixel 1000. As micro-LED pixel 1000, micro-LED pixel 1002 may include a substrate 1012, a n-doped (or p-doped) semiconductor material layer 1022 with pits 1026 formed therein. Pits 1026 may be similar to pits 1024 and may have facets on semipolar planes of the semiconductor material as described above. Active layers 1042, an optional EBL layer 1052, and a p-doped (or n-doped) semiconductor material layer 1062 may be epitaxially grown on the semipolar facets of pits 1026 to form micro-LED subpixels with n-doped (or p-doped) semiconductor material layer 1022. In micro-LED pixel 1002, p-doped (or n-doped) semiconductor material layer 1062 may be a thin layer and may not completely fill pits 1026.

As in micro-Led pixel 1000, a TCO layer 1072 (e.g., ITO layer) may be formed on the micro-LED subpixels to make electrical contact with p-doped (or n-doped) semiconductor material layer 1062. A mirror layer 1082, such as a metal mirror layer (e.g., Al, Pt, Au, Ag, Ni, Ti, Cu, W, or any combination thereof, such as ITO/Ag/Pt/Au, Ag/Pt/Au, or Al/Ni/Au) or a conductive DBR mirror, may be deposited on TCO layer 1072. Mirror layer 1082 may be used to reflect light emitted in active layers 1042 to the light-emitting surface of the micro-LED subpixel. A bonding material layer 1092, such as a metal layer (e.g., Cu, Al, Au, Ni, Ti, or any combination thereof), may be formed on mirror layer 1082. Mirror layer 1082 and bonding material layer 1092 may be etched to form individual micro-LED pixels 1002 that each include multiple micro-LED subpixels connected together by portions of mirror layer 1082 and bonding material layer 1092. The regions between micro-LED pixels 1002 may be filled with a dielectric material 1036 (e.g., $SiO_2$) to electrically isolate the individual micro-LED pixels 1002. Micro-LED pixels 1002 may be bonded to a CMOS backplane through bonding material layer 1092 as described in detail below.

In some embodiments, mirror layer 1082 and bonding material layer 1092 for each micro-LED subpixel may be formed by depositing a dielectric layer on TCO layer 1072, patterning the dielectric layer, and depositing mirror layer 1080 and bonding material layer 1090 through the patterned dielectric layer. In some embodiments, mirror layer 1082 and bonding material layer 1092 may be etched to form individual micro-LED subpixels with respective mirrors and bonding pads, where regions between the micro-LED subpixels may be filled with dielectric material 1036 (e.g., $SiO_2$). The individual micro-LED subpixels may not be grouped on the micro-LED wafer, and may be grouped into micro-LED pixels by bonding the bonding pads of a group of micro-LED subpixels to a metal bonding pad on the CMOS backplane.

Because the light-emitting active layers 1040 and 1042 shown in FIGS. 10A and 10B are grown on semipolar planes and there may not be etching of the light-emitting layers after the growth (and thus no etched sidewalls of the light-emitting active layers with high defect densities for non-radiative recombination), the internal quantum efficiencies of the micro-LED pixels may be high. Moreover, growing light-emitting layers on semipolar facets may more reliably incorporate more indium in the InGaN layers before stacking faults may be formed, such that high quality (e.g., low strain and low defect density) InGaN layers with a higher indium concentration (and thus a lower bandgap) may be grown on the semipolar facets of the pit structures. Increasing the amount of indium incorporated into the $In_xGa_{1-x}N$ quantum well layers may reduce the bandgap energy, thereby increasing the wavelength of the light emitted by the LED (e.g., from blue light to green and/or red light). Therefore, a larger red-shift of the wavelength of the emitted light and a high quantum efficiency may be achieved by the micro-LED pixels.

Figure 11C:
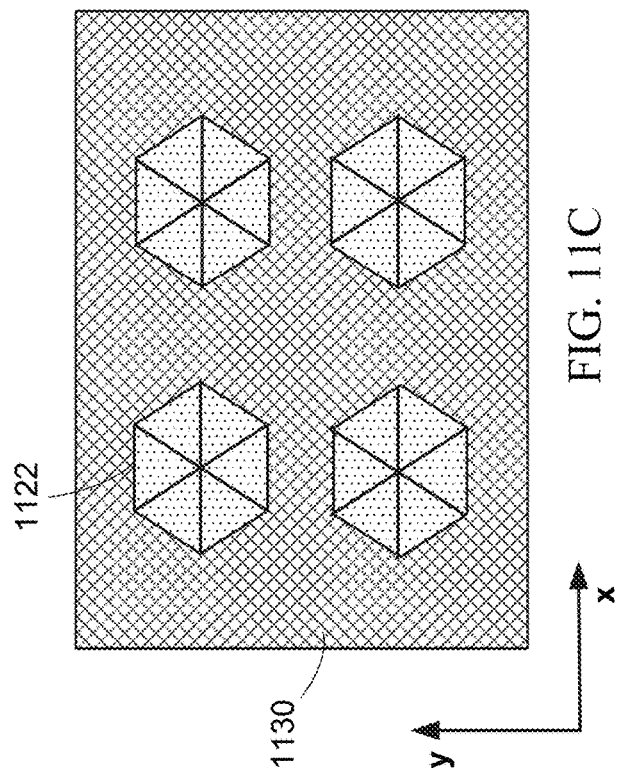
Figure 11D:
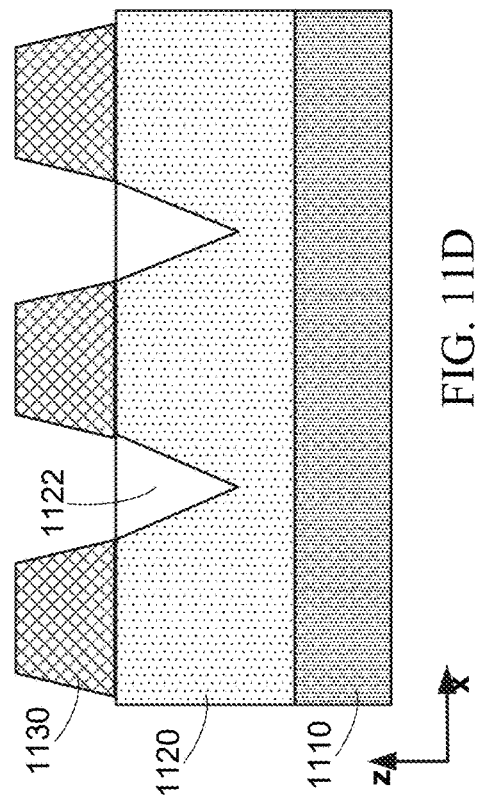
Figure 11A:
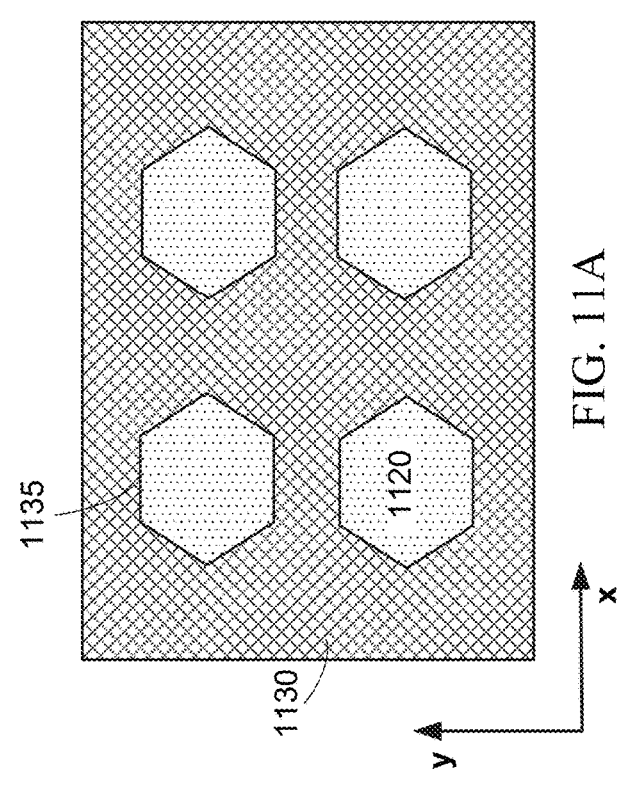
Figure 11B:
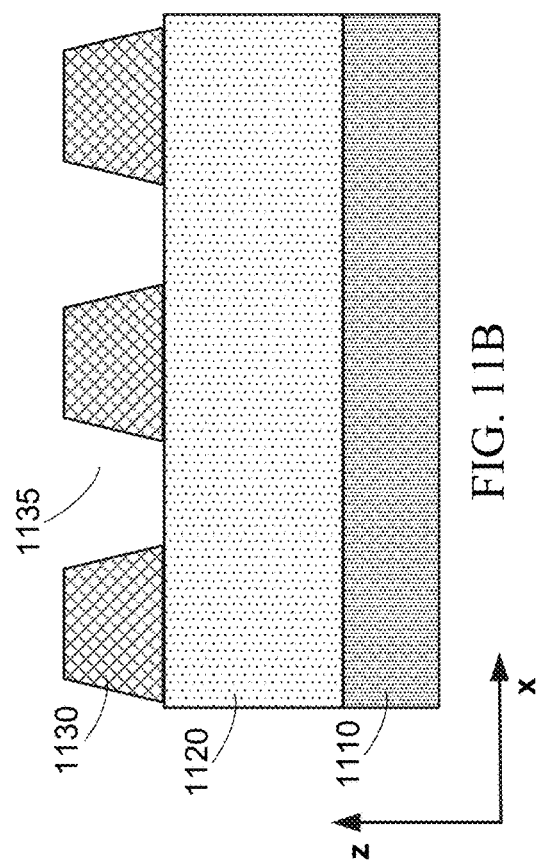

FIGS. 11A-11J illustrate an example of a process of fabricating micro-LED pixels of FIGS. 10A and 10B according to certain embodiments. FIGS. 11A and 11B are a top view and a cross-sectional view, respectively, showing a mask layer 1130 formed on an n-doped GaN layer 1120. The n-doped GaN layer 1120 may be epitaxially grown on a substrate 1110, such as a GaN or sapphire substrate with a buffer layer as described above. The n-doped GaN layer 1120 grown on substrate 1110 may be doped with, for example, Si or Ge. The top and bottom surface of n-doped GaN layer 1120 may align with the c-plane of the GaN material. Mask layer 1130 may include, for example, a $SiO_2$ mask layer with polygonal (e.g., hexagonal) or circular apertures 1135 as shown in the top view illustrated by FIG. 11A. Apertures 1135 may have a linear dimension about a few hundred nanometers or larger, such as about 100 nm, about 200 nm, about 500 nm, or larger. In some embodiments, each edge of an aperture 1135 that has a hexagonal shape may be at the intersection of the c-plane and an m-plane of n-doped GaN layer 1120. Apertures 1135 may have slanted sidewalls as shown in the cross-sectional view illustrated in FIG. 11B. The slant angles of the slanted sidewalls of apertures 1135 in mask layer 1130 may be between about 50° and about 75° or between about 58° and 66°, such as about 58° or about 62°, with respect to the c-plane of n-doped GaN layer 1120.

FIGS. 11C and 11D are a top view and a cross-sectional view, respectively, showing a plurality of pits 1122 formed in n-doped GaN layer 1120 according to certain embodiments. Pits 1122 may have an inverted pyramid shape with a V shape in the cross-sectional view shown in FIG. 11D. The bottom of pits 1122 may not be flat, and thus pits 1122 may not have a truncated pyramid shape. Pits 1122 may be formed by etching n-doped GaN layer 1120 using mask layer 1130, such that the facets of pits 1122 etched in n-doped GaN layer 1120 may have slant angles similar to the slant angles of the sidewalls of apertures 1135 in mask layer 1130. Thus, facets of the inverted pyramid-shaped pits 1122 may have angles θ between about 50° and about 75° (e.g., between about 58° and 66°) with respect to the c-plane of semiconductor material layer 1020, such as in the (11$\bar{2}$2) s2-plane (θ at about 58°) or in the (10$\bar{1}$1) s5-plane (θ at about 62°).

FIGS. 11E and 11F are a top view and a cross-sectional view, respectively, showing a plurality of micro-LED subpixels formed in pits 1122 of n-doped GaN layer 1120 according to certain embodiments. As described above with respect to FIG. 10A, active layers 1140 (e.g., GaN barrier layers and InGaN quantum well layers of multiple quantum wells or a multi-quantum well) may be epitaxially grown on the facets of pits 1122. Mask layer 1130 may also be used as an overgrowth mask layer during the epitaxial growth. Because n-doped GaN layer 1120 is covered by mask layer 1130, active layers 1140 may only be grown inside pits 1122 and on facets of pits 1122 as shown in FIG. 11F, and may have a growth surface in a semipolar plane (e.g., the (10$\bar{1}$1) s5-plane). An optional EBL 1150 may be epitaxially grown on active layers 1140. A p-doped semiconductor layer 1160 may then be grown on EBL 1150 or active layers 1140. P-doped semiconductor layer 1160 may be a GaN layer doped with, for example, Mg, Ca, Zn, or Be. In the example shown in FIG. 11F, p-doped semiconductor layer 1160 may fill the remaining regions of pits 1122 and may also be grown on top of pits 1122. The n-doped GaN layer 1120, active layers 1140, and p-doped semiconductor layer 1160 in each pit 1122 may form a light-emitting micro-LED subpixel with light-emitting active regions on side surfaces of a pyramid. As described above with respect to FIG. 10B, in some embodiments, p-doped semiconductor layer 1160 may include a thin layer and may not fill the remaining regions of pits 1122. Active layers 1140, EBL 1150, and p-doped semiconductor layer 1160 may be epitaxially grown using suitable techniques described above, such as MBE or MOCVD process, without the need for a planarization process such as a chemical mechanical polishing (CMP) process. In embodiments where etched pits 1122 are small (e.g., <500 nm or <200 nm) and may not have an inverted hexagonal pyramid shape, facets of pits 1122 may, during the overgrowth of active layers 1140, be naturally reconstructed in the preferred orientations to form the inverted hexagonal pyramid shape.

FIGS. 11G and 11H are a top view and a cross-sectional view, respectively, showing an example of a micro-LED pixel including a plurality of micro-LED subpixels formed in pits 1122 of n-doped GaN layer 1120 according to certain embodiments. In the illustrated example, a TCO layer 1170 (e.g., ITO layer) may be formed on the micro-LED subpixels to make electrical contact with, for example, p-dope semiconductor layer 1160 of the micro-LED subpixels. A mirror layer 1180, such as a metal mirror layer (e.g., Al, Pt, Au, Ag, Ni, Ti, Cu, W, or any combination thereof, such as ITO/Ag/Pt/Au, Ag/Pt/Au, or Al/Ni/Au) or a conductive DBR mirror, may be deposited on TCO layer 1170. Mirror layer 1180 may be used to reflect light emitted in active layers 1140 to the light-emitting surface of the micro-LED subpixel. A bonding material layer 1190, such as a metal layer (e.g., Cu, Al, Au, Ni, Ti, or any combination thereof), may be formed on mirror layer 1180. TCO layer 1170, mirror layer 1180, and bonding material layer 1190 may be etched to form individual micro-LED pixels that each include multiple micro-LED subpixels connected together by portions of TCO layer 1170, mirror layer 1180, and bonding material layer 1190. Regions between micro-LED pixels 1100 may include a dielectric material 1132 (e.g., SiO$_2$) to electrically isolate the individual micro-LED pixels. The micro-LED pixels on substrate 1110 may be bonded to a CMOS backplane through bonding material layer 1190 as described in detail below.

In some embodiments, TCO layer 1170, mirror layer 1180, and bonding material layer 1190 for each micro-LED subpixel may be formed by depositing a dielectric layer, patterning the dielectric layer, and depositing TCO layer 1170, mirror layer 1180, and bonding material layer 1190 through the patterned dielectric layer. In some embodiments, TCO layer 1170, mirror layer 1180, and bonding material layer 1190 may be etched to form individual micro-LED subpixels with respective p-contacts, mirrors, and bonding pads, where regions between the micro-LED subpixels may be filled with a dielectric material (e.g., SiO$_2$). The individual micro-LED subpixels may not be grouped on the micro-LED wafer, but may be grouped into micro-LED pixels by bonding the bonding pads of a group of micro-LED subpixels to a bonding metal pad on the CMOS backplane.

Figure 11I:
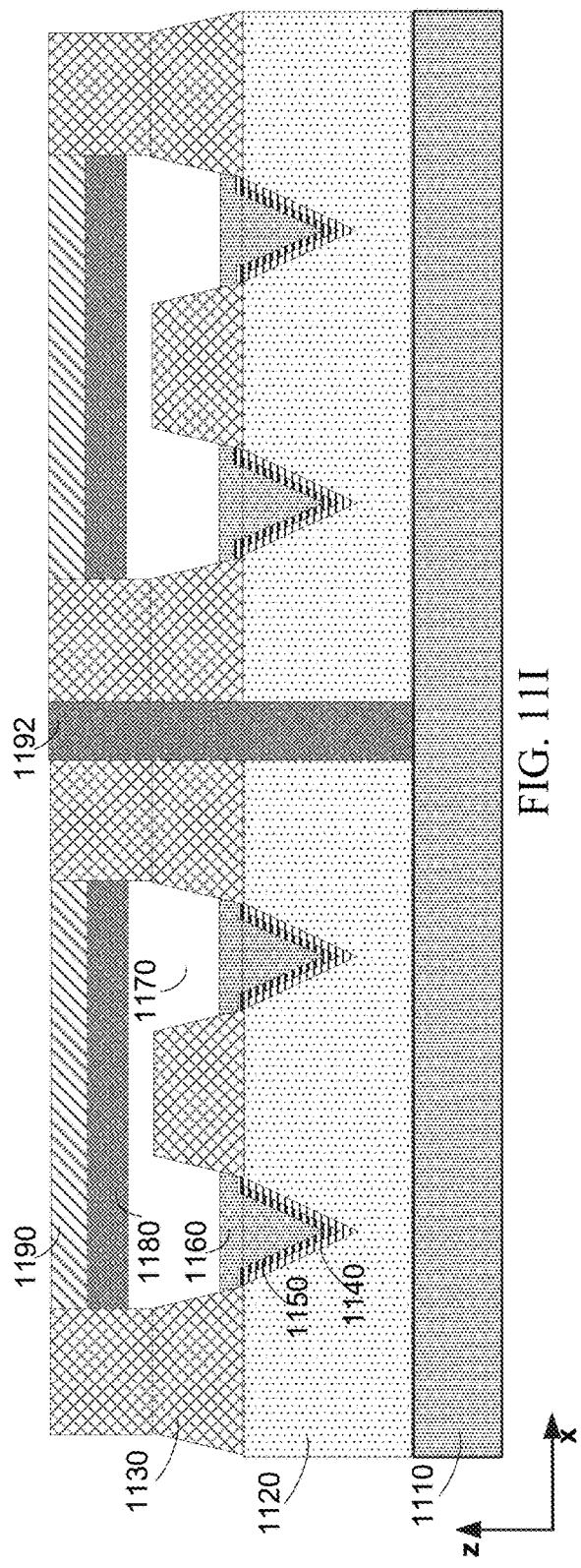

FIG. 11I shows an example of a micro-LED wafer including multiple micro-LED pixels described above. In the illustrated example, two adjacent micro-LED pixels are shown. The two adjacent micro-LED pixels may be optically isolated by a metal plug 1192 formed in the dielectric layer (e.g., SiO$_2$ layer) and the n-doped GaN layer 1120. Metal plug 1192 may also be used to reflect light emitted in active layers 1140. In some embodiments, metal plug 1192 may also be used to electrically connect the n-doped GaN layer 1120 to drive circuits on the CMOS backplane.

Figure 11J:
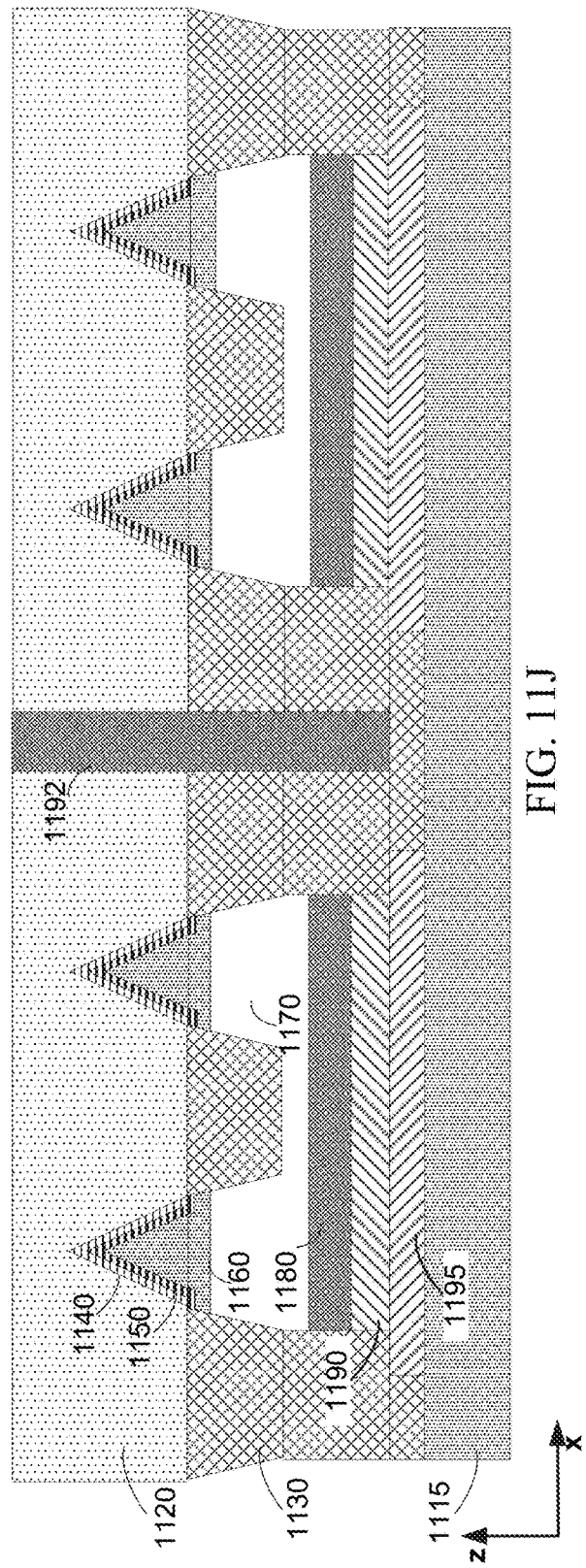

FIG. 11J shows an example of bonding the micro-LED wafer including multiple micro-LED pixels described above to a CMOS backplane 1115. CMOS backplane 1115 may include drive circuits fabricated on a silicon wafer, and may including a bonding layer that includes metal bonding pads 1195 (e.g., formed in a dielectric layer). Metal bonding pads 1195 of CMOS backplane 1115 may be bonded to patterned bonding material layer 1190 on the micro-LED wafer. Substrate 1110 may be removed after the bonding, and optional light extraction structures (e.g., rough surfaces, gratings, and/or micro-lenses) may be formed on the exposed n-doped GaN layer 1120. Light emitted in active layers 1140 may be coupled out of the micro-LED pixels from the n-doped GaN layer 1120.

In some embodiments, n-doped GaN layer 1120, the dielectric layer (e.g., SiO$_2$ layer and mask layer 1130), TCO layer 1170, mirror layer 1180, and bonding material layer 1190 may be etched after the wafer-to-wafer bonding and after the removal of substrate 1110, to form trenches in the layers to isolate individual micro-LED pixels that each include multiple micro-LED subpixels connected together by portions of TCO layer 1170, mirror layer 1180, bonding material layer 1190, and/or the metal bonding pad on CMOS backplane 1115. Dielectric materials and metal plugs 1192 may be deposited in the etched trenches to electrically and optically isolate adjacent micro-LED pixels and/or to provide electrical connections from CMOS backplane 1115 to n-doped GaN layer 1120.

As described above, small c-plane micro-LEDs with a linear dimension less than a few microns may have a high carrier density in the active region when external voltage signals are applied. The higher carrier density in the active region may increase the nonradiative Auger recombination and blue shift of the wavelength of the emitted light. The semipolar facets of the pit structures described herein may have a large angle (e.g., greater than about 50°) with respect to the c-plane, and thus the light-emitting layers grown on the semipolar facets of the pit structures may have a light-emitting area much larger than a lateral area of the pit structure. Therefore, for a given injected current, the semipolar micro-LED pixels disclosed herein may have a lower effective carrier density in the light-emitting region, and thus may have a lower Auger recombination rate and a lower wavelength blue-shift for micro-LEDs with small linear dimensions.

Figure 12:
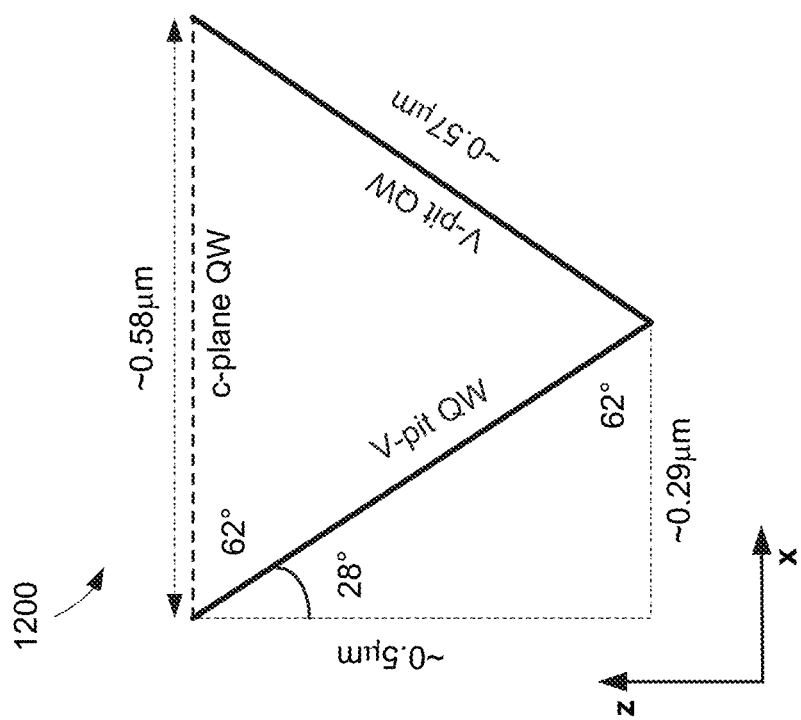
FIG. 12 illustrates light-emitting area increase in an example of a micro-LED subpixel with light-emitting layers formed on semipolar facets of a pit structure formed in a semiconductor material layer according to certain embodiments.

FIG. 12 illustrates the increase of light-emitting area in an example of a micro-LED subpixel 1200 with light-emitting layers formed on semipolar facets of a pit formed in a semiconductor material layer according to certain embodiments. In the cross-sectional view of the example shown in FIG. 12, a horizontal linear dimension of the V-shaped pit may be about 0.58 μm, a depth of the V-shaped pit may be about 0.5 μm, and the facets of the V-shaped pit may have a slant angle about 62° with respect to the c-plane. Thus, each facet of the V-shaped pit may have a length about 0.57 μm. Therefore, the area of the light-emitting active layers formed on the facets of the V-shaped pit may be much larger than the area of light-emitting active layers formed in the same region on the c-plane of the semiconductor material layer. As such, for the same injected current, the carrier density in the light-emitting region of the micro-LED subpixel disclosed herein may be much lower. As a result, the micro-LED subpixel disclosed herein may have a lower Auger recombination rate and a lower wavelength blue-shift.

Furthermore, the micro-LED wafer described herein may include an array of micro-LED subpixels each formed in a pit structure, and a group of micro-LED subpixels may be electrically connected together to form a micro-LED pixel. As such, the micro-LED wafer may be bonded to a CMOS backplane without alignment or with minimum alignment to make an array of micro-LED pixels each including multiple micro-LED subpixels bonded to a same metal bonding pad on the CMOS backplane. Therefore, the bonding process may be relatively easy and more reliable.

Even though the examples described with respect to FIGS. 10A-11J show inverted pyramid-shaped pit structures formed in a semiconductor material layer (e.g., an n-doped semiconductor layer) by etching the semiconductor material layer, in some embodiments, other methods may be used to form the inverted pyramid-shaped pit structures in the semiconductor material layer. For example, the inverted pyramid-shaped pit structures may be formed in a semiconductor material layer by an overgrowth process described below.

FIGS. 13A-13D illustrate an example of a process of fabricating micro-LED pixels with light-emitting layers regrown on semipolar facets of pit structures formed by overgrowth according to certain embodiments. FIG. 13A shows a substrate 1310 with an overgrowth mask layer 1320 formed thereon. As described above, substrate 1310 may include, for example, a GaN substrate or a sapphire substrate with a buffer layer formed thereon. Mask layer 1320 may include a patterned dielectric layer (e.g., SiO$_2$ layer) that includes an array of apertures 1322. To form small pit structures, such as inverted pyramid-shaped structures with a horizontal linear dimension about or less than 500 nm, apertures 1322 in mask layer 1320 may have a polygonal or a circular shape with a diameter about or less than, for example, 200 nm or 100 nm. To form large pit structures, such as inverted pyramid structures with a horizontal linear dimension about or greater than 500 nm, apertures 1322 in mask layer 1320 may have a polygonal (e.g., hexagonal) shape, where each edge of the polygon (e.g., hexagon) is at the intersection of the c-plane and an m-plane of the six m-planes of the hexagonal crystal lattice structure of substrate 1310. For example, each sidewall of an aperture 1322 may align with an m-plane of substrate 1310.

FIG. 13B shows semiconductor structures 1330 grown on substrate 1310 through overgrowth mask layer 1320 according to certain embodiments. Semiconductor structures 1330 may be epitaxially grown on substrate 1310 using suitable techniques such as the MBE or MOCVD process described above. The epitaxial growth may first occur through apertures 1322, and may then extend laterally. Semiconductor structures 1330 may include, for example, n-doped GaN. When apertures 1322 in mask layer 1320 have the size, shape, and sidewall orientation described above, the epitaxial growth on an exposed region of substrate 1310 through an aperture 1322 may naturally form a truncated pyramid-shaped semiconductor structure 1330 due to the preferential growth planes of the overgrowth process. The sidewalls of each truncated pyramid may align with a semipolar plane, such as the (11$\bar{2}$2) s2-plane or the (10$\bar{1}$1) s5-plane. Adjacent semiconductor structures 1330 may form a pit structure 1332 having a shape of an inverted pyramid.

FIG. 13C shows that a mask layer 1340 may be formed on semiconductor structures 1330. Mask layer 1340 may be a patterned dielectric layer (e.g., SiO$_2$ layer) and may be used as a mask layer for subsequent regrowth processes. Mask layer 1340 may cover the top surfaces of the truncated pyramid-shaped semiconductor structures 1330 such that only the sidewalls of the truncated pyramid-shaped semiconductor structures 1330 (or sidewalls of the inverted pyramid-shaped pit structures 1332) are exposed during the subsequent regrowth processes.

FIG. 13D shows that active layers 1350 (e.g., one or more InGaN quantum well layers and GaN barrier layers), an optional EBL 1360, and a p-doped semiconductor layer 1370 (e.g., p-doped GaN layer) may be epitaxially grown on the semipolar facets of the inverted pyramid-shaped pit structures 1332 as described above. Thus, a micro-LED subpixel may be formed in each pit structure 1332. As described above, p-contacts, p-side mirrors, and bonding pads may be formed on the micro-LED subpixels, and the micro-LED-wafer may be bonded to a CMOS backplane.

GaN layers grown on sapphire substrates with buffer layers may have a threading dislocation density (TDD) about 1×10$^8$ cm$^{-2}$. Semipolar micro-LEDs epitaxially grown on a substrate with a semipolar growth surface may have poor crystalline quality than c-plane micro-LEDS grown on a substrate with a c-plane growth surface, and may have a higher threading dislocation density and more basal stacking faults. When a threading dislocation intersects a growth surface, it may interfere with the overgrowth process. Thus, a thicker buffer layer on the sapphire substrate may be used such that the threading dislocations may coalesce, which can lead to better crystal quality in the active layers grown on the buffer layer. However, a thicker buffer layer may also increase stress in the epitaxial layers, which may cause higher wafer bowing or warping that may make wafer bonding and subsequent processing more challenging. In the semipolar micro-LED subpixels formed using the process described above with respect to FIGS. 13A-13D, a thin buffer layer may be sufficient because the threading dislocations may be masked by mask layer 1320 and thus would not intersect the facets of the inverted pyramid-shaped pit structure for active layer overgrowth. Therefore, semipolar micro-LEDs fabricated using techniques disclosed herein may have a much better epitaxial layer quality in the active regions even with a thin buffer layer.

Figure 14:
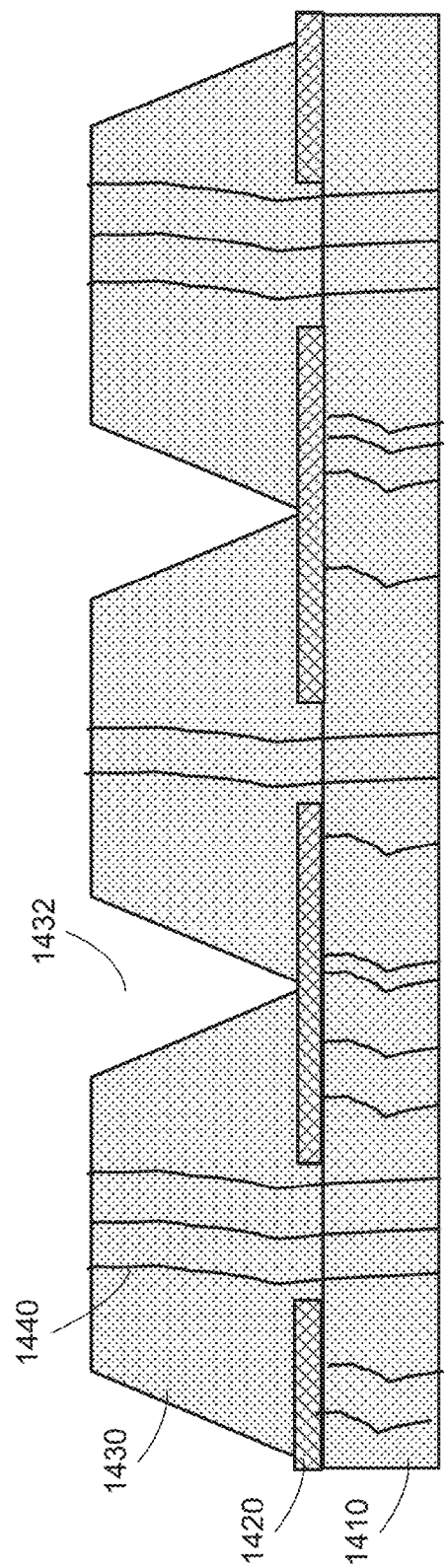
FIG. 14 illustrates an example of avoiding threading dislocations in light-emitting layers regrown on semipolar facets of pit structures formed by overgrowth according to certain embodiments.

FIG. 14 illustrates an example of avoiding threading dislocations in light-emitting layers regrown on semipolar facets of pits 1432 formed by overgrowth according to certain embodiments. In the illustrated example, semiconductor structures 1430 may be grown on a substrate 1410 (or a buffer layer on a substrate) through a mask layer 1420. There may be threading dislocations 1440 in semiconductor structures 1430 due to threading dislocations in substrate 1410 or the buffer layer. Threading dislocations 1440 may intersect the top surfaces of semiconductor structures 1430. However, in the regions of pits 1432 formed by adjacent semiconductor structures 1430, the threading dislocations may be masked by mask layer 1420 and thus may not intersect the facets of pits 1432 where the active layers may be grown. Therefore, the epitaxial growth of the active layers may not be interfered by the threading dislocations.

Figure 15A:
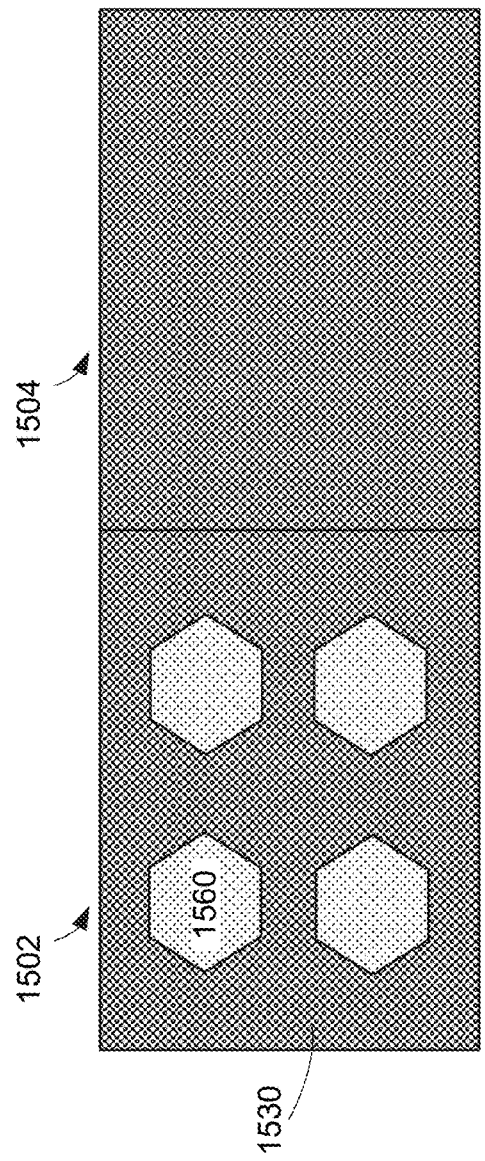
Figure 15B:
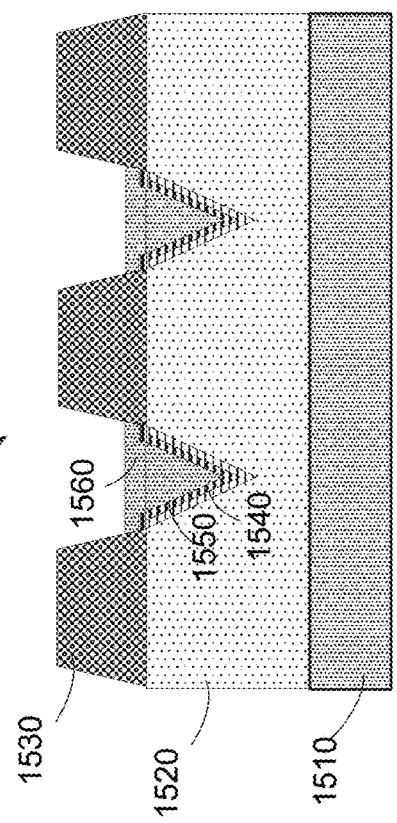

FIGS. 15A-15G illustrate an example of a process of fabricating multi-color micro-LED pixels with light-emitting layers grown on semipolar facets of pit structures formed in a doped semiconductor material layer 1520 (e.g., n-doped GaN layer) according to certain embodiments. FIG. 15A is a top view of examples of blue micro-LED subpixels fabricated in a region 1502 of doped semiconductor material layer 1520 on a substrate 1510. FIG. 15B is a cross-sectional view of the examples of blue micro-LED subpixels fabricated in region 1502 of doped semiconductor material layer 1520. In the illustrated example, a patterned mask layer 1530 may be formed on doped semiconductor material layer 1520. On region 1502 of doped semiconductor material layer 1520, mask layer 1530 may include an array of apertures. On region 1504 of doped semiconductor material layer 1520, mask layer 1530 may be a solid mask layer. Mask layer 1530 may include a dielectric layer, such as a $SiO_2$ layer or a SiN layer. Blue micro-LED subpixels may be fabricated in region 1502 of doped semiconductor material layer 1520 using materials and techniques described above, for example, with respect to FIGS. 10A-11F and FIGS. 13A-13D. Each micro-LED subpixel may be formed in a pit in doped semiconductor material layer 1520 and may include active layers 1540, an EBL layer 1550, and an oppositely doped semiconductor layer 1560 (e.g., a p-doped GaN layer) as described above. No micro-LED subpixels may be formed in region 1504 due to the solid mask layer on region 1504 of doped semiconductor material layer 1520.

FIG. 15C is a top view of an example of a device formed by covering the blue micro-LED subpixels in region 1502 with a dielectric layer 1570 and forming pits 1522 in region 1504 of doped semiconductor material layer 1520. In some embodiments, mask layer 1530 may include SiN, and dielectric layer 1570 may include $SiO_2$. Mask layer 1530 on region 1504 may be patterned to include an array of apertures. FIGS. 15D and 15E are cross-sectional views of the device of FIG. 15C in region 1502 and region 1504, respectively, of doped semiconductor material layer 1520. In the illustrated example, dielectric layer 1570 may be deposited on the blue micro-LED subpixels in region 1502 to prevent regrowth of epitaxial layers on blue micro-LED subpixels as shown in FIG. 15D. Mask layer 1530 in region 1504 may be patterned and may be used to etch pits 1522 in doped semiconductor material layer 1520, as shown in FIG. 15E.

Figure 15F:
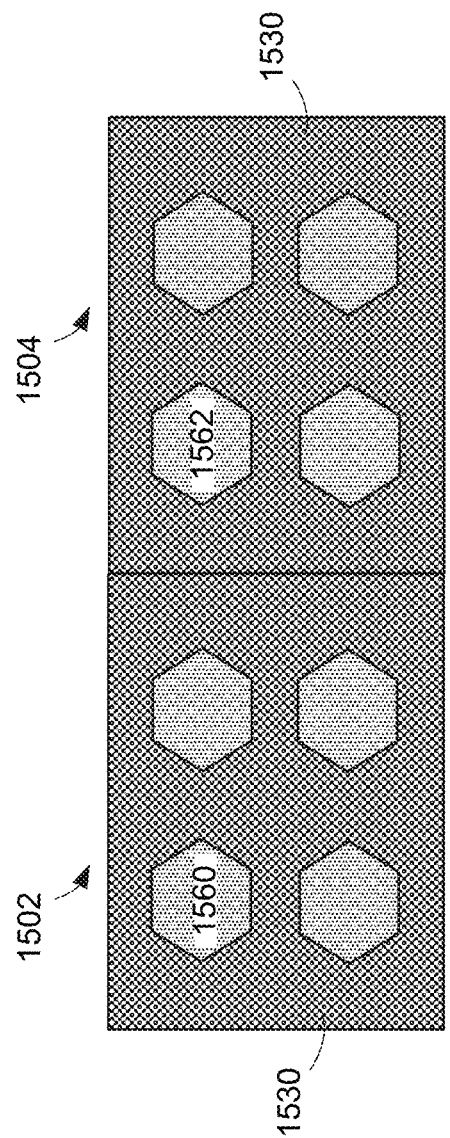
Figure 15G:
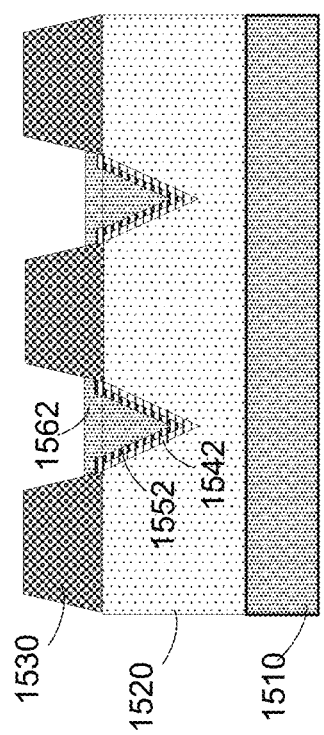

FIG. 15F is a top view of an example of a device including blue micro-LED subpixels in region 1502 and green micro-LED subpixels in region 1504 of doped semiconductor material layer 1520. FIG. 15G is a cross-sectional view of green micro-LED subpixels formed in region 1504 of doped semiconductor material layer 1520 using techniques and materials described above. Each green micro-LED subpixel may include active layers 1542, an EBL 1552, and a p-doped GaN layer 1562 grown on facets of a pit 1522. During the growth of active layers 1542, EBL 1552, and p-doped GaN layer 1562, blue micro-LED subpixels in region 1502 may be covered by dielectric layer 1570, and thus the epitaxial layers for the green micro-LED subpixels may not be grown in region 1502. After the growth of active layers 1542, EBL 1552, and p-doped GaN layer 1562 in region 1504, dielectric layer 1570 may be removed and a p-contact layer, a p-side mirror layer, and a bonding material layer may be formed and patterned on the blue micro-LED subpixels and the green micro-LED subpixels as described above. The LED wafer including the blue micro-LED subpixels and the green micro-LED subpixels (or blue micro-LED pixels and green micro-LED pixels) may then be bonded to a CMOS backplane as described above.

Figure 16:
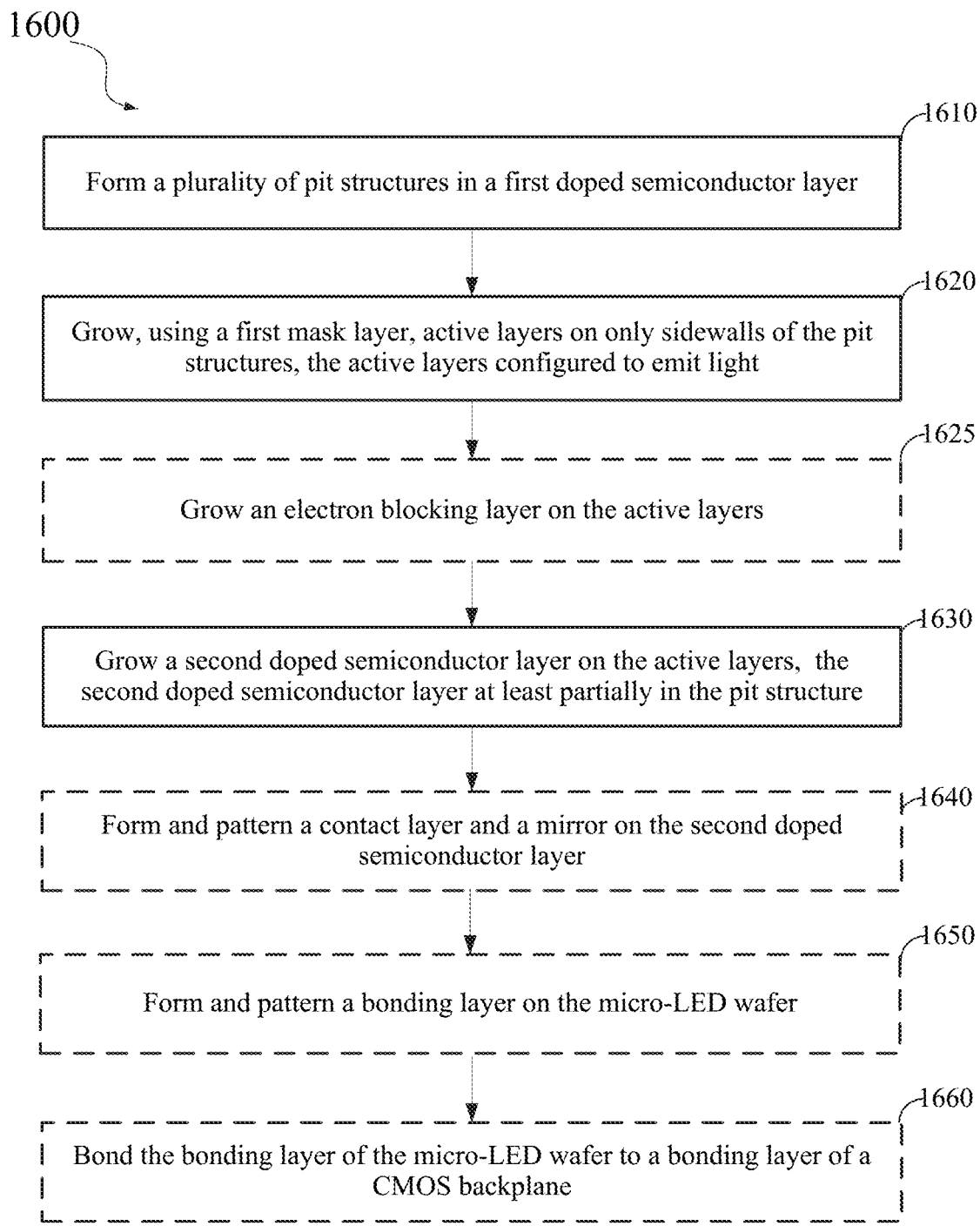
FIG. 16 includes a flowchart illustrating an example of a process of fabricating micro-LED pixels with light-emitting layers formed on semipolar facets of pit structure formed in a semiconductor material layer according to certain embodiments.

FIG. 16 includes a flowchart 1600 illustrating an example of a process of fabricating micro-LED pixels with light-emitting layers formed on semipolar facets of pit structures formed in a semiconductor material layer according to certain embodiments. It is noted that the operations illustrated in FIG. 16 provide particular processes for fabricating micro-LEDs. Other sequences of operations can also be performed according to alternative embodiments. For example, alternative embodiments may perform the operation in a different order. Moreover, the individual operations illustrated in FIG. 16 can include multiple sub-operations that can be performed in various sequences as appropriate for the individual operation. Furthermore, some operations can be added or removed depending on the particular applications. In some implementations, two or more operations may be performed in parallel. One of ordinary skill in the art would recognize many variations, modifications, and alternatives.

Operations in block 1610 of flowchart 1600 may include forming a plurality of pit structures in a first doped semiconductor layer. The first doped semiconductor layer may include, for example, an n-doped GaN layer. In some embodiments, each of the plurality of pit structures may be characterized by a shape of an inverted pyramid. In some embodiments, a linear dimension of a base of the inverted pyramid may be greater than about 500 nm, the base may have a shape of a polygon, and each edge of the polygon may be at the intersection between the c-plane and an m-plane of the first doped semiconductor layer. In some embodiments, each pit structure of the plurality of pit structures may be characterized by a maximum horizontal linear dimension less than 500 nm (e.g., less than about 200 nm or about 100 nm), and a base of the pit structure may have a circular or a polygonal shape. In some embodiments, an angle between a sidewall of a pit structure and a c-plane of the first doped semiconductor layer may be between 50° and 75° or between 58° and 66°, such as about 58° or about 62°.

In some embodiments, forming the plurality of pit structures in the first doped semiconductor layer may include forming an etch mask layer on the first doped semiconductor layer, and etching the first doped semiconductor layer using the etch mask layer to form the pit structures in the first doped semiconductor layer as described above with respect to, for example, FIGS. 10A-11D. The etch mask layer may include an array of apertures, where sidewalls of each aperture of the array of apertures may be slanted with respect to the c-plane of the first doped semiconductor layer, and each aperture of the array of apertures may be characterized by a circular or polygonal shape. In some embodiments, edges of the polygonal shape may be at the intersections between the c-plane and m-planes of the first doped semiconductor layer. In some embodiments, an angle between a sidewall of an aperture of the etch mask layer and the c-plane of the first doped semiconductor layer may be between about 50° and about 75° or between about 58° and 66°, such as about 58° or about 62°.

In some embodiments, forming the plurality of pit structures in the first doped semiconductor layer may include forming an overgrowth mask layer that includes an array of apertures on a substrate or a buffer layer, and growing the first doped semiconductor layer through the array of apertures, where sidewalls of semiconductor structures grown through the array of apertures may form the plurality of pit structures. Each aperture of the array of apertures may be characterized by a circular or polygonal shape. In some embodiments, edges of the polygonal shape may be at the intersections between the c-plane and m-planes of the substrate or the buffer layer. In some embodiments, each aperture of the array of apertures may have a linear dimension less than bout 500 nm, less than about 200 nm, or less than about 100 nm.

Operations in block 1620 may include growing, using a first mask layer, active layers on only sidewalls of the pit structures, where the first mask layer may cover other regions of the first doped semiconductor layer and only expose the pit structures, such that the active layers may only be grown on sidewalls of the pit structures. In some embodiments, the first mask layer may be the etch mask layer used to etch the plurality of pit structures. The active layers may include barrier layers and one or more quantum well layers configured to emit light. For example, the active layers may include GaN barrier layers and one or more InGaN quantum well layers. MBE, MOCVD, or other techniques may be used to grow the active layers. Optional, an electron blocking layer may be epitaxially grown on the active layers in block 1625.

Operations in block 1630 may include growing a second doped semiconductor layer on the active layers (or the electron blocking layer), where the second doped semiconductor layer may be at least partially in the pit structures. The second doped semiconductor layer may include, for example, a p-doped GaN layer. The first doped semiconductor layer, the active layers, and the second doped semiconductor layer at each pit structure may form a micro-LED subpixel. In some embodiments, the second doped semiconductor layer may completely fill the plurality of pit structures.

In some embodiments, as described with respect to, for example, FIGS. 15A-15G, operations in blocks 1610-1630 may first be performed in a first set of regions of the first doped semiconductor layer to fabricate micro-LED subpixels that emit light in a first wavelength range (e.g., blue light), and may then be performed in a second set of regions of the first doped semiconductor layer to fabricate micro-LED subpixels that emit light in a second wavelength range, such as green light.

In some embodiments, additional layers, such as a contact layer, a mirror layer, and a bonding layer, may be formed and patterned on the micro-LED subpixels, and then the wafer including the micro-LED subpixels may be bonded to a CMOS backplane that includes drive circuit for driving and controlling the micro-LED subpixels, as described above with respect to, for example, FIGS. 11G-11J.

For example, in block 1640, a contact layer (e.g., an ITO layer) and a mirror layer (e.g., a metal or a conductive DBR layer) may be formed and patterned on the second doped semiconductor layer. In block 1650, a bonding layer (e.g., a metal layer) may be formed and patterned on the mirror layer to form bonding pads on the micro-LED wafer. In some embodiments, the regions between the bonding pads may include a dielectric material, such as SiO$_2$. Thus, the bonding layer on the micro-LED wafer may include bonding pads and the dielectric material. In some embodiments, the contact layer, the mirror layer, and/or the bonding pads on the micro-LED wafer may be patterned such that multiple micro-LED subpixels may be electrically connected together to form a micro-LED pixel that may be independently controlled. In some embodiments, each micro-LED subpixel on the micro-LED wafer may have its own bonding pad that is not electrically shorted to bonding pads of other micro-LED subpixels on the micro-LED wafer.

Operations in block 1660 may include bonding the bonding layer of the micro-LED wafer to a bonding layer of the CMOS backplane. The bonding layer of the CMOS backplane may include an array of metal bonding pads, where the gap between two adjacent metal bonding pads may be greater than a linear dimension of the bonding pad of a micro-LED subpixel. In embodiments where each micro-LED subpixel on the micro-LED wafer has its own bonding pad that is not electrically shorted to bonding pads of other micro-LED subpixels on the micro-LED wafer, the micro-LED wafer and the CMOS backplane may be bonded without alignment, because adjacent metal bonding pads on the CMOS backplane would not be connected to a same micro-LED subpixel. In some embodiments, the micro-LED wafer and the CMOS backplane may be bonded using hybrid bonding techniques described below with respect to, for example, FIGS. 18A-18D.

In some embodiments, after the bonding, the substrate of the micro-LED wafer may be removed, and light extraction structures (e.g., rough surfaces, grating, or micro-lenses) may be formed on the light-emitting surface of the bonded structure, such as a surface of the exposed first doped semiconductor layer.

FIG. 17A illustrates an example of a method of die-to-wafer bonding for arrays of LEDs according to certain embodiments. In the example shown in FIG. 17A, an LED array 1701 may include a plurality of LEDs 1707 on a carrier substrate 1705. Carrier substrate 1705 may include various materials, such as GaAs, InP, GaN, AlN, sapphire, SiC, Si, or the like. LEDs 1707 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 1703 may include a base layer 1709 having passive or active integrated circuits (e.g., driver circuits 1711) fabricated thereon. Base layer 1709 may include, for example, a silicon wafer. Driver circuits 1711 may be used to control the operations of LEDs 1707. For example, the driver circuit for each LED 1707 may include a 2T1C pixel structure that has two transistors and one capacitor. Wafer 1703 may also include a bonding layer 1713. Bonding layer 1713 may include various materials, such as a metal, an oxide, a dielectric, CuSn, AuTi, and the like. In some embodiments, a patterned layer 1715 may be formed on a surface of bonding layer 1713, where patterned layer 1715 may include a metallic grid made of a conductive material, such as Cu, Ag, Au, Al, or the like.

LED array 1701 may be bonded to wafer 1703 via bonding layer 1713 or patterned layer 1715. For example, patterned layer 1715 may include metal pads or bumps made of various materials, such as CuSn, AuSn, or nanoporous Au, that may be used to align LEDs 1707 of LED array 1701 with corresponding driver circuits 1711 on wafer 1703. In one example, LED array 1701 may be brought toward wafer 1703 until LEDs 1707 come into contact with respective metal pads or bumps corresponding to driver circuits 1711. Some or all of LEDs 1707 may be aligned with driver circuits 1711, and may then be bonded to wafer 1703 via patterned layer 1715 by various bonding techniques, such as metal-to-metal bonding. After LEDs 1707 have been bonded to wafer 1703, carrier substrate 1705 may be removed from LEDs 1707.

FIG. 17B illustrates an example of a method of wafer-to-wafer bonding for arrays of LEDs according to certain embodiments. As shown in FIG. 17B, a first wafer 1702 may include a substrate 1704, a first semiconductor layer 1706, active layers 1708, and a second semiconductor layer 1710. Substrate 1704 may include various materials, such as GaAs, InP, GaN, AlN, sapphire, SiC, Si, or the like. First semiconductor layer 1706, active layers 1708, and second semiconductor layer 1710 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 1706 may be an n-type layer, and second semiconductor layer 1710 may be a p-type layer. For example, first semiconductor layer 1706 may be an n-doped GaN layer (e.g., doped with Si or Ge), and second semiconductor layer 1710 may be a p-doped GaN layer (e.g., doped with Mg, Ca, Zn, or Be). Active layers 1708 may include, for example, one or more GaN layers, one or more InGaN layers, one or more AlInGaP layers, and the like, which may form one or more heterostructures, such as one or more quantum wells or MQWs.

In some embodiments, first wafer 1702 may also include a bonding layer. Bonding layer 1712 may include various materials, such as a metal, an oxide, a dielectric, CuSn, AuTi, or the like. In one example, bonding layer 1712 may include p-contacts and/or n-contacts (not shown). In some embodiments, other layers may also be included on first wafer 1702, such as a buffer layer between substrate 1704 and first semiconductor layer 1706. The buffer layer may include various materials, such as polycrystalline GaN or AlN. In some embodiments, a contact layer may be between second semiconductor layer 1710 and bonding layer 1712. The contact layer may include any suitable material for providing an electrical contact to second semiconductor layer 1710 and/or first semiconductor layer 1706.

First wafer 1702 may be bonded to wafer 1703 that includes driver circuits 1711 and bonding layer 1713 as described above, via bonding layer 1713 and/or bonding layer 1712. Bonding layer 1712 and bonding layer 1713 may be made of the same material or different materials. Bonding layer 1713 and bonding layer 1712 may be substantially flat. First wafer 1702 may be bonded to wafer 1703 by various methods, such as metal-to-metal bonding, eutectic bonding, metal oxide bonding, anodic bonding, thermo-compression bonding, ultraviolet (UV) bonding, and/or fusion bonding.

As shown in FIG. 17B, first wafer 1702 may be bonded to wafer 1703 with the p-side (e.g., second semiconductor layer 1710) of first wafer 1702 facing down (i.e., toward wafer 1703). After bonding, substrate 1704 may be removed from first wafer 1702, and first wafer 1702 may then be processed from the n-side. The processing may include, for example, the formation of certain mesa shapes for individual LEDs, as well as the formation of optical components corresponding to the individual LEDs.

Figure 18A:
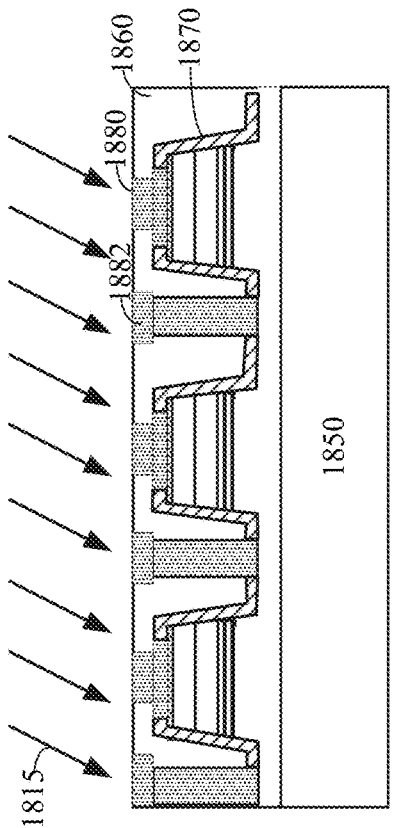
FIGS. 18A-18D illustrates an example of a method of hybrid bonding for arrays of LEDs according to certain embodiments.

FIGS. 18A-18D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 18A shows a substrate 1810 with passive or active circuits 1820 manufactured thereon. As described above with respect to FIGS. 17A-17B, substrate 1810 may include, for example, a silicon wafer. Circuits 1820 may include driver circuits for the arrays of LEDs. A bonding layer may include dielectric regions 1840 and contact pads 1830 connected to circuits 1820 through electrical interconnects 1822. Contact pads 1830 may include, for example, Cu, Ag, Au, Al, W, Mo, Ni, Ti, Pt, Pd, or the like. Dielectric materials in dielectric regions 1840 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 1805. The activated surface may be atomically clean and may be reactive for formation of direct bonds between wafers when they are brought into contact, for example, at room temperature.

Figure 18B:
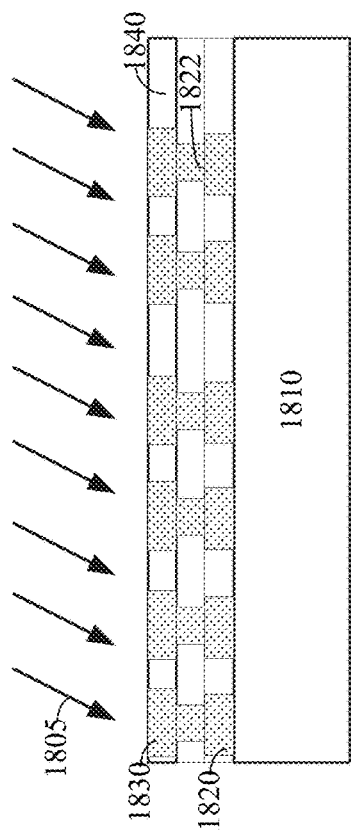

FIG. 18B illustrates a wafer 1850 including an array of micro-LEDs 1870 fabricated thereon as described above. Wafer 1850 may be a carrier wafer and may include, for example, GaAs, InP, GaN, AlN, sapphire, SiC, Si, or the like. Micro-LEDs 1870 may include an n-type layer, an active region, and a p-type layer epitaxially grown on wafer 1850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 1880 and n-contacts 1882 may be formed in a dielectric material layer 1860 deposited on the mesa structures and may make electrical contacts with the p-type layer and the n-type layers, respectively. Dielectric materials in dielectric material layer 1860 may include, for example, SiCN, $SiO_2$, SiN, $Al_2O_3$, $HfO_2$, $ZrO_2$, $Ta_2O_5$, or the like. P-contacts 1880 and n-contacts 1882 may include, for example, Cu, Ag, Au, Al, W, Mo, Ni, Ti, Pt, Pd, or the like. The top surfaces of p-contacts 1880, n-contacts 1882, and dielectric material layer 1860 may form a bonding layer. The bonding layer may be planarized and polished using, for example, chemical mechanical polishing, where the polishing may cause dishing in p-contacts 1880 and n-contacts 1882. The bonding layer may then be cleaned and activated by, for example, an ion (e.g., plasma) or fast atom (e.g., Ar) beam 1815. The activated surface may be atomically clean and reactive for formation of direct bonds between wafers when they are brought into contact, for example, at room temperature.

Figure 18C:
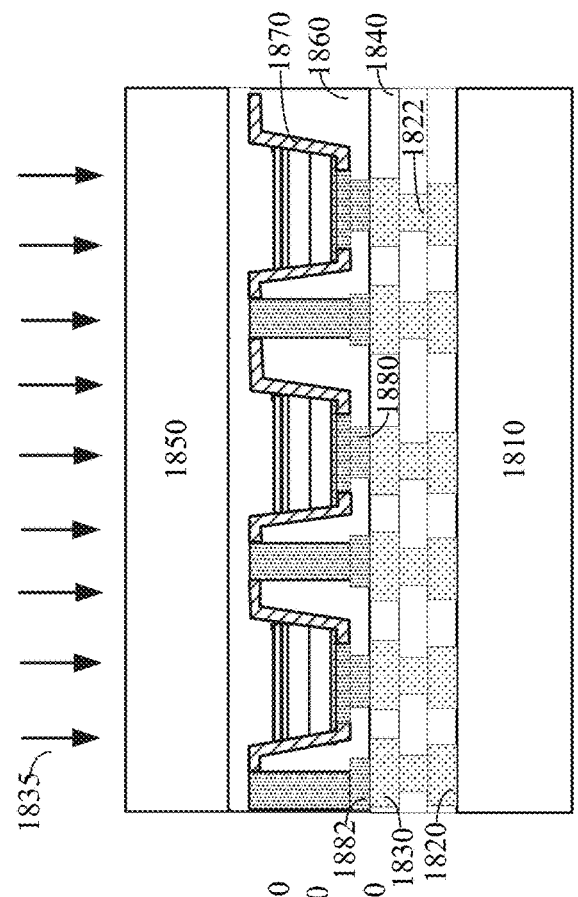

FIG. 18C illustrates a room temperature bonding process for bonding the dielectric materials in the bonding layers. For example, after the bonding layer that includes dielectric regions 1840 and contact pads 1830 and the bonding layer that includes p-contacts 1880, n-contacts 1882, and dielectric material layer 1860 are surface activated, wafer 1850 and micro-LEDs 1870 may be turned upside down and brought into contact with substrate 1810 and the circuits formed thereon. In some embodiments, compression pressure 1825 may be applied to substrate 1810 and wafer 1850 such that the bonding layers are pressed against each other. Due to the surface activation and the dishing in the contacts, dielectric regions 1840 and dielectric material layer 1860 may be in direct contact because of the surface attractive force, and may react and form chemical bonds between them because the surface atoms may have dangling bonds and may be in unstable energy states after the activation. Thus, the dielectric materials in dielectric regions 1840 and dielectric material layer 1860 may be bonded together with or without heat treatment or pressure.

Figure 18D:
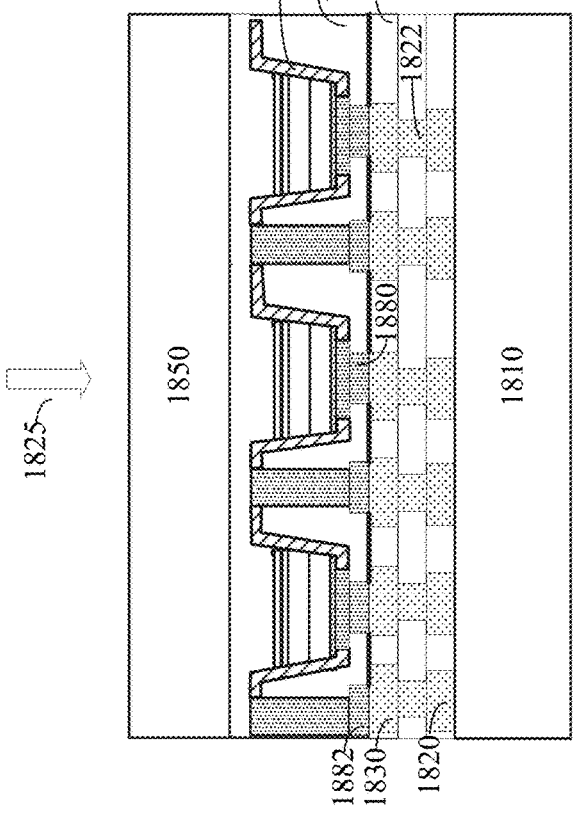

FIG. 18D illustrates an annealing process for bonding the contacts in the bonding layers after bonding the dielectric materials in the bonding layers. For example, contact pads 1830 and p-contacts 1880 or n-contacts 1882 may be bonded together by annealing at, for example, about 180-400° C. or higher. During the annealing process, heat 1835 may cause the contacts to expand more than the dielectric materials (due to different coefficients of thermal expansion), and thus may close the dishing gaps between the contacts such that contact pads 1830 and p-contacts 1880 or n-contacts 1882 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light-emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 19:
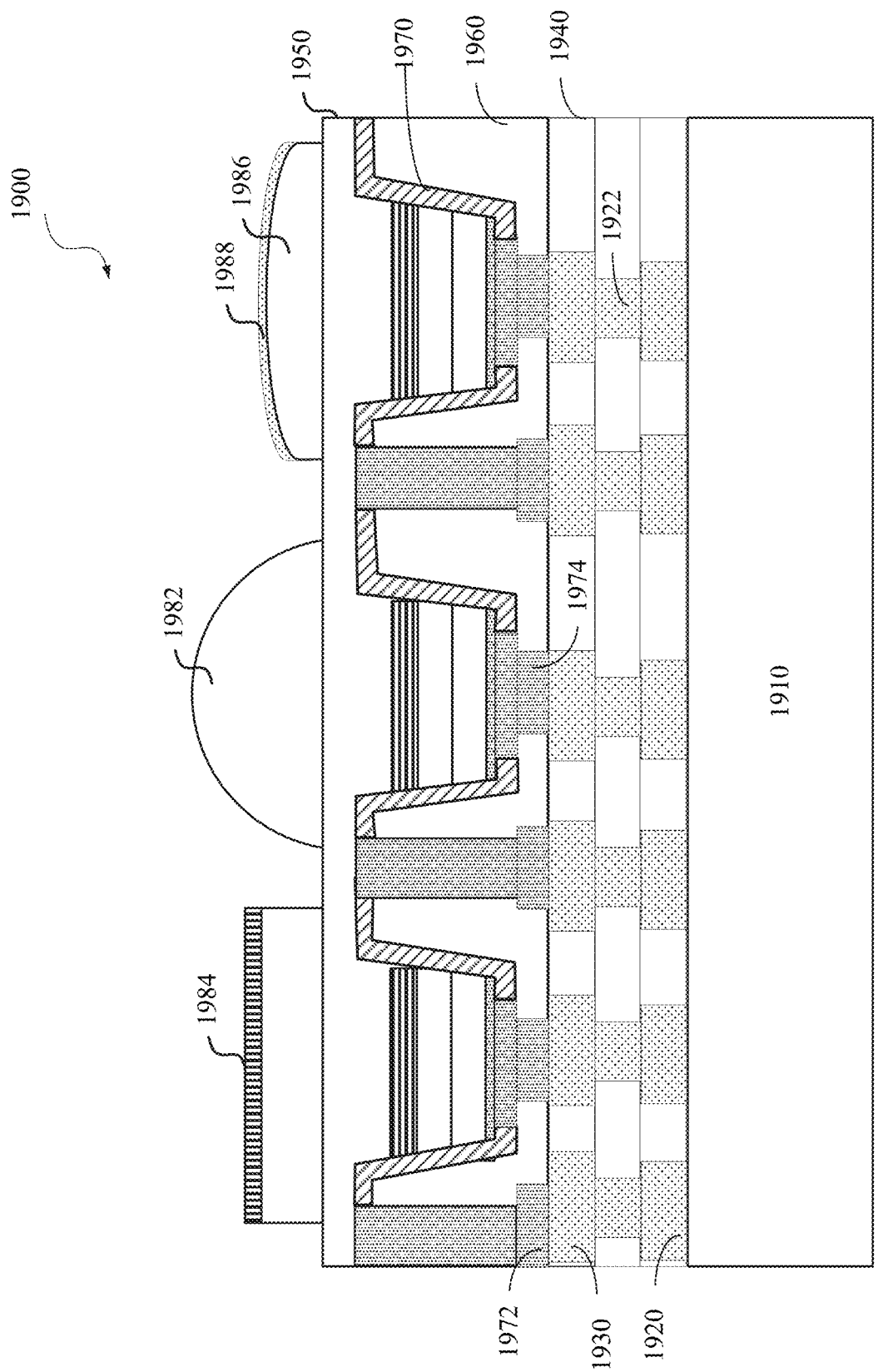
FIG. 19 illustrates an example of an LED array with secondary optical components fabricated thereon according to certain embodiments.

FIG. 19 illustrates an example of an LED array 1900 with secondary optical components fabricated thereon according to certain embodiments. LED array 1900 may be made by bonding an LED chip or wafer with a silicon wafer including electrical circuits fabricated thereon, using any suitable bonding techniques described above with respect to, for example, FIGS. 17A-18D. In the example shown in FIG. 19, LED array 1900 may be bonded using a wafer-to-wafer hybrid bonding technique as described above with respect to FIG. 18A-18D. LED array 1900 may include a substrate 1910, which may be, for example, a silicon wafer. Integrated circuits 1920, such as LED driver circuits, may be fabricated on substrate 1910. Integrated circuits 1920 may be connected to p-contacts 1974 and n-contacts 1972 of micro-LEDs 1970 through interconnects 1922 and contact pads 1930, where contact pads 1930 may form metallic bonds with p-contacts 1974 and n-contacts 1972. Dielectric layer 1940 on substrate 1910 may be bonded to dielectric layer 1960 through fusion bonding.

The substrate (not shown) of the LED chip or wafer may be thinned or may be removed to expose the n-type layer 1950 of micro-LEDs 1970. Various secondary optical components, such as a spherical micro-lens 1982, a grating 1984, a micro-lens 1986, an antireflection layer 1988, and the like, may be formed in or on top of n-type layer 1950. For example, spherical micro-lens arrays may be etched in the semiconductor materials of micro-LEDs 1970 using a grayscale mask and a photoresist with a linear response to exposure light, or using an etch mask formed by thermal reflowing of a patterned photoresist layer. The secondary optical components may also be etched in a dielectric layer deposited on n-type layer 1950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, $SiCN$, $SiO_2$, $SiN$, $Al_2O_3$, $HfO_2$, $ZrO_2$, $Ta_2O_5$, or the like. In some embodiments, a micro-LED 1970 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 19 to show some examples of secondary optical components that can be formed on micro-LEDs 1970, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 20:
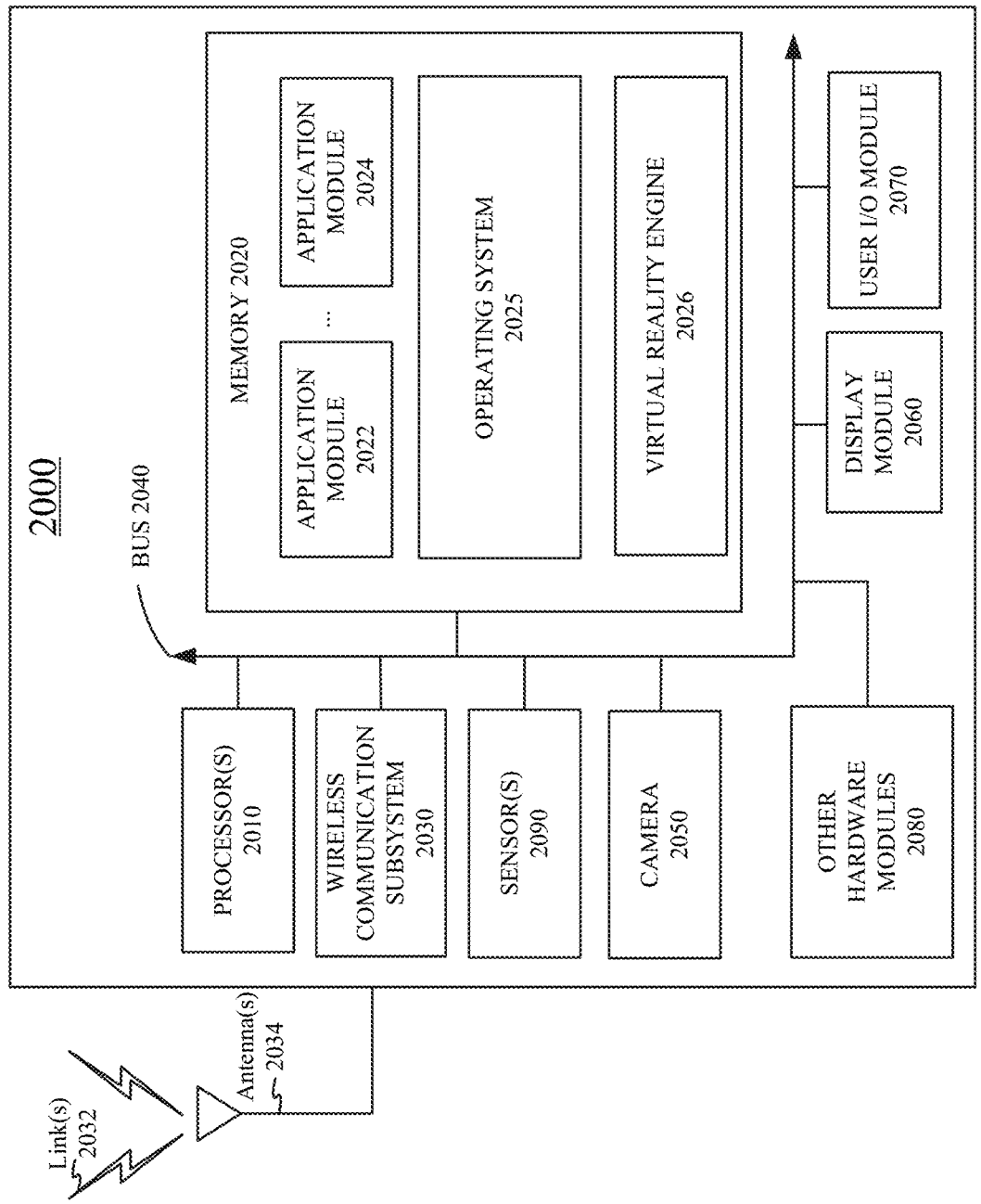
FIG. 20 is a simplified block diagram of an electronic system of an example of a near-eye display according to certain embodiments.

FIG. 20 is a simplified block diagram of an example electronic system 2000 of an example near-eye display (e.g., HMD device) for implementing some of the examples disclosed herein. Electronic system 2000 may be used as the electronic system of an HMD device or other near-eye displays described above. In this example, electronic system 2000 may include one or more processor(s) 2010 and a memory 2020. Processor(s) 2010 may be configured to execute instructions for performing operations at a number of components, and can be, for example, a general-purpose processor or microprocessor suitable for implementation within a portable electronic device. Processor(s) 2010 may be communicatively coupled with a plurality of components within electronic system 2000. To realize this communicative coupling, processor(s) 2010 may communicate with the other illustrated components across a bus 2040. Bus 2040 may be any subsystem adapted to transfer data within electronic system 2000. Bus 2040 may include a plurality of computer buses and additional circuitry to transfer data.

Memory 2020 may be coupled to processor(s) 2010. In some embodiments, memory 2020 may offer both short-term and long-term storage and may be divided into several units. Memory 2020 may be volatile, such as static random access memory (SRAM) and/or dynamic random access memory (DRAM) and/or non-volatile, such as read-only memory (ROM), flash memory, and the like. Furthermore, memory 2020 may include removable storage devices, such as secure digital (SD) cards. Memory 2020 may provide storage of computer-readable instructions, data structures, program modules, and other data for electronic system 2000. In some embodiments, memory 2020 may be distributed into different hardware modules. A set of instructions and/or code might be stored on memory 2020. The instructions might take the form of executable code that may be executable by electronic system 2000, and/or might take the form of source and/or installable code, which, upon compilation and/or installation on electronic system 2000 (e.g., using any of a variety of generally available compilers, installation programs, compression/decompression utilities, etc.), may take the form of executable code.

In some embodiments, memory 2020 may store a plurality of application modules 2022 through 2024, which may include any number of applications. Examples of applications may include gaming applications, conferencing applications, video playback applications, or other suitable applications. The applications may include a depth sensing function or eye tracking function. Application modules 2022-2024 may include particular instructions to be executed by processor(s) 2010. In some embodiments, certain applications or parts of application modules 2022-2024 may be executable by other hardware modules 2080. In certain embodiments, memory 2020 may additionally include secure memory, which may include additional security controls to prevent copying or other unauthorized access to secure information.

In some embodiments, memory 2020 may include an operating system 2025 loaded therein. Operating system 2025 may be operable to initiate the execution of the instructions provided by application modules 2022-2024 and/or manage other hardware modules 2080 as well as interfaces with a wireless communication subsystem 2030 which may include one or more wireless transceivers. Operating system 2025 may be adapted to perform other operations across the components of electronic system 2000 including threading, resource management, data storage control and other similar functionality.

Wireless communication subsystem 2030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2000 may include one or more antennas 2034 for wireless communication as part of wireless communication subsystem 2030 or as a separate component coupled to any portion of the system. Depending on desired functionality, wireless communication subsystem 2030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2030 may permit data to be exchanged with a network, other computer systems, and/or any other devices described herein. Wireless communication subsystem 2030 may include a means for transmitting or receiving data, such as identifiers of HMD devices, position data, a geographic map, a heat map, photos, or videos, using antenna(s) 2034 and wireless link(s) 2032. Wireless communication subsystem 2030, processor(s) 2010, and memory 2020 may together comprise at least a part of one or more of a means for performing some functions disclosed herein.

Embodiments of electronic system 2000 may also include one or more sensors 2090. Sensor(s) 2090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2090 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2000 may include a display module 2060. Display module 2060 may be a near-eye display, and may graphically present information, such as images, videos, and various instructions, from electronic system 2000 to a user. Such information may be derived from one or more application modules 2022-2024, virtual reality engine 2026, one or more other hardware modules 2080, a combination thereof, or any other suitable means for resolving graphical content for the user (e.g., by operating system 2025). Display module 2060 may use LCD technology, LED technology (including, for example, OLED, ILED, µ-LED, AMOLED, TOLED, etc.), light-emitting polymer display (LPD) technology, or some other display technology.

Electronic system 2000 may include a user input/output module 2070. User input/output module 2070 may allow a user to send action requests to electronic system 2000. An action request may be a request to perform a particular action. For example, an action request may be to start or end an application or to perform a particular action within the application. User input/output module 2070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2000. In some embodiments, user input/output module 2070 may provide haptic feedback to the user in accordance with instructions received from electronic system 2000. For example, the haptic feedback may be provided when an action request is received or has been performed.

Electronic system 2000 may include a camera 2050 that may be used to take photos or videos of a user, for example, for tracking the user's eye position. Camera 2050 may also be used to take photos or videos of the environment, for example, for VR, AR, or MR applications. Camera 2050 may include, for example, a complementary metal-oxidesemiconductor (CMOS) image sensor with a few millions or tens of millions of pixels. In some implementations, camera 2050 may include two or more cameras that may be used to capture 3-D images.

In some embodiments, electronic system 2000 may include a plurality of other hardware modules 2080. Each of other hardware modules 2080 may be a physical module within electronic system 2000. While each of other hardware modules 2080 may be permanently configured as a structure, some of other hardware modules 2080 may be temporarily configured to perform specific functions or temporarily activated. Examples of other hardware modules 2080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2080 may be implemented in software.

In some embodiments, memory 2020 of electronic system 2000 may also store a virtual reality engine 2026. Virtual reality engine 2026 may execute applications within electronic system 2000 and receive position information, acceleration information, velocity information, predicted future positions, or any combination thereof of the HMD device from the various sensors. In some embodiments, the information received by virtual reality engine 2026 may be used for producing a signal (e.g., display instructions) to display module 2060. For example, if the received information indicates that the user has looked to the left, virtual reality engine 2026 may generate content for the HMD device that mirrors the user's movement in a virtual environment. Additionally, virtual reality engine 2026 may perform an action within an application in response to an action request received from user input/output module 2070 and provide feedback to the user. The provided feedback may be visual, audible, or haptic feedback. In some implementations, processor(s) 2010 may include one or more GPUs that may execute virtual reality engine 2026.

In various implementations, the above-described hardware and modules may be implemented on a single device or on multiple devices that can communicate with one another using wired or wireless connections. For example, in some implementations, some components or modules, such as GPUs, virtual reality engine 2026, and applications (e.g., tracking application), may be implemented on a console separate from the head-mounted display device. In some implementations, one console may be connected to or support more than one HMD.

In alternative configurations, different and/or additional components may be included in electronic system 2000. Similarly, functionality of one or more of the components can be distributed among the components in a manner different from the manner described above. For example, in some embodiments, electronic system 2000 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A light-emitting diode comprising:
    an n-type semiconductor layer including a pit structure formed therein;
    active layers grown only on sidewalls of the pit structure and configured to emit light; and
    a p-type semiconductor layer on the active layers and at least partially in the pit structure.

2. The light-emitting diode of claim 1, wherein the pit structure is characterized by a shape of an inverted pyramid.

3. The light-emitting diode of claim 2, wherein:
    a base of the inverted pyramid is characterized by a shape of a polygon; and
    each edge of the polygon is at an intersection of a c-plane and an m-plane of the n-type semiconductor layer.

4. The light-emitting diode of claim 1, wherein the pit structure is characterized by a maximum horizontal linear dimension less than 500 nm.

5. The light-emitting diode of claim 1, wherein an angle between a sidewall of the pit structure and a c-plane of the n-type semiconductor layer is between 50° and 75°.

6. The light-emitting diode of claim 5, wherein the angle between the sidewall of the pit structure and the c-plane of the n-type semiconductor layer is between 58° and 66°.

7. The light-emitting diode of claim 1, wherein the active layers include GaN barrier layers and one or more InGaN quantum well layers.

8. The light-emitting diode of claim 1, further comprising an electron blocking layer between the active layers and the p-type semiconductor layer.

9. A light source comprising:
    an array of light-emitting diodes (LEDs), each LED of the array of LEDs comprising:
        an n-type semiconductor layer including a pit structure formed therein;
        active layers grown only on sidewalls of the pit structure and configured to emit light; and
        a p-type semiconductor layer on the active layers and at least partially in the pit structure.

10. The light source of claim 9, wherein:
    a base of the pit structure is characterized by a shape of a polygon; and
    each edge of the polygon is at an intersection of a c-plane and an m-plane of the n-type semiconductor layer.

11. The light source of claim 9, wherein a base of the pit structure is characterized by a maximum horizontal linear dimension less than 500 nm.

12. The light source of claim 9, wherein an angle between a sidewall of the pit structure and a c-plane of the n-type semiconductor layer is between 50° and 75°.

13. The light source of claim 9, wherein each LED of the array of LEDs further comprises:
    a p-contact coupled to the p-type semiconductor layer of the LED;
    a conductive mirror coupled to the p-contact; and
    a bonding pad electrically coupled to the conductive mirror and the p-contact.

14. The light source of claim 13, wherein the p-contacts, the conductive mirrors, and the bonding pads of a group of LEDs in the array of LEDs are electrically connected to form a single pixel.

15. The light source of claim 13, further comprising:
    a backplane including drive circuits and metal bonding pads formed thereon, wherein the bonding pads of a group of LEDs in the array of LEDs are electrically connected to a same metal bonding pad of the metal bonding pads on the backplane.

16. The light source of claim 9, wherein:

a first group of LEDs in the array of LEDs is configured to emit visible light in a first wavelength range; and a second group of LEDs in the array of LEDs is configured to emit visible light in a second wavelength range.

17. The light source of claim 16, wherein a third group of LEDs in the array of LEDs is configured to emit visible light in a third wavelength range.

18. A method comprising:

forming a plurality of pit structures in a first doped semiconductor layer;

growing, using a first mask layer, active layers on only sidewalls of the pit structures, the active layers configured to emit light; and growing a second doped semiconductor layer on the active layers, the second doped semiconductor layer at least partially in the plurality of pit structures.

19. The method of claim 18, wherein forming the plurality of pit structures in the first doped semiconductor layer comprises:

forming an etch mask layer on the first doped semiconductor layer, wherein:

the etch mask layer includes an array of apertures;

sidewalls of each aperture of the array of apertures are slanted with respect to a c-plane of the first doped semiconductor layer; and each aperture of the array of apertures is characterized by a circular or polygonal shape, wherein edges of the polygonal shape are at intersections of a c-plane and m-planes of the first doped semiconductor layer; and etching the first doped semiconductor layer using the etch mask layer to form the pit structures in the first doped semiconductor layer.

20. The method of claim 18, wherein forming the plurality of pit structures in the first doped semiconductor layer comprises:

forming a second mask layer on a substrate or a buffer layer, wherein:

the second mask layer includes an array of apertures; and each aperture of the array of apertures is characterized by a circular or polygonal shape, wherein edges of the polygonal shape are at intersections between a c-plane and m-planes of the substrate or the buffer layer; and growing the first doped semiconductor layer through the array of apertures, wherein sidewalls of semiconductor structures grown through the array of apertures form the plurality of pit structures.

* * * * *